(12) United States Patent
Ausserlechner et al.

(10) Patent No.: US 7,750,743 B2
(45) Date of Patent: Jul. 6, 2010

(54) COMPENSATING QUANTITY-PROVIDING CIRCUIT, STRESS-COMPENSATING CIRCUIT, STRESS-COMPENSATED CIRCUIT, APPARATUS FOR PROVIDING A COMPENSATING QUANTITY, METHOD FOR PROVIDING A COMPENSATING QUANTITY AND RING OSCILLATOR

(75) Inventors: Udo Ausserlechner, Villach (AT); Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 93 days.

(21) Appl. No.: 11/966,953

(22) Filed: Dec. 28, 2007

(65) Prior Publication Data
US 2008/0157850 A1 Jul. 3, 2008

(30) Foreign Application Priority Data
Dec. 28, 2006 (DE) .................. 10 2006 061 721

(51) Int. Cl.
*H03B 1/00* (2006.01)
(52) U.S. Cl. .......................... 331/57; 327/509
(58) Field of Classification Search .......... 331/57; 327/509
See application file for complete search history.

(56) References Cited

U.S. PATENT DOCUMENTS 4,236,832 A 12/1980 Komatsu et al.
5,061,907 A 10/1991 Rasmussen
2005/0162160 A1 7/2005 Ausserlechner et al.
2006/0017514 A1 1/2006 Lee et al.
2006/0082419 A1 4/2006 Sakaguchi
2006/0226921 A1 10/2006 Hsu

FOREIGN PATENT DOCUMENTS

EP 0 040 795 A2 12/1981
WO WO 94/18753 8/1994

OTHER PUBLICATIONS

Tietze, U., et al., "Halbleiter-Schaltungstechnik," 12$^{th}$ Edition, Chapter 3, pp. 171-175, 2002, Springer-Verlag, Berlin/Heidelberg.
Motz, M., et al., "An Integrated Magnetic Sensor with Two Continuous-Time ΣΔ-Converters and Stress Compensation Capability," 2006 IEEE International Solid-State Circuits Conference, Digest of Technical Papers, Feb. 7, 2006, 10 pages, IEEE.
Bradley, A.T., et al. "Piezoresistive Characteristics of Short-Channel MOSFETs on (100) Silicon," IEEE Transactions on Electron Devices, vol. 48, No. 9, Sep. 2001, pp. 2009-2015, IEEE.
Motz, M., et al., "An Integrated Magnetic Sensor with Two Continuous-Time ΣΔ-Converters and Stress Compensation Capability," 2006 IEEE International Solid-State Circuits Conference, Digest of Technical Papers, Feb. 6-9, 2006, 23 pages, IEEE.

*Primary Examiner*—Joseph Chang
(74) *Attorney, Agent, or Firm*—Slater & Matsil, L.L.P.

(57) ABSTRACT

A compensating quantity-providing circuit includes a frequency signal generator having an output for a frequency signal the frequency of which depends on mechanical stress in a circuit, and a compensating quantity provider having an input for the frequency signal and an output for a compensating quantity which is based on the frequency signal.

39 Claims, 10 Drawing Sheets

//COMPENSATING QUANTITY-PROVIDING CIRCUIT, STRESS-COMPENSATING CIRCUIT, STRESS-COMPENSATED CIRCUIT, APPARATUS FOR PROVIDING A COMPENSATING QUANTITY, METHOD FOR PROVIDING A COMPENSATING QUANTITY AND RING OSCILLATOR

This application claims priority to German Patent Application No. 10 2006 061 721.5, which was filed on Dec. 28, 2006, and is incorporated herein by reference in its entirety.

TECHNICAL FIELD

The present invention generally relates to a compensating quantity-providing circuit, a stress-compensating circuit, a stress-compensated circuit, an apparatus for providing a compensating quantity, a method for providing a compensating quantity and a ring oscillator.

BACKGROUND

A stress-compensating circuit in the context of the present description advantageously is meant to be a circuit for compensating mechanical tension, mechanical strain and/or mechanical stress.

A stress-compensated circuit advantageously is meant to be a circuit where the influences of mechanical tension, mechanical strain and/or mechanical stress are compensated.

A plurality of different circuits, the output signals of which are dependent on mechanical stress, is used in the art. Thus, mechanical stress or mechanical stress effects exemplarily influence the precision of Hall sensors, band gap references (such as, for example, reference voltage sources or reference current sources), temperature sensors and stable on-chip oscillators.

In order to avoid and/or reduce a loss in precision, it is frequently desirable to compensate the mechanical stress or mechanical stress effects, i.e., to reduce, minimize or, in the ideal case, eliminate totally the influence of mechanical stress on the output signal of, for example, a Hall sensor, a band gap reference, a temperature sensor or an on-chip oscillator.

Up to now, a change in the electrical voltages or currents from L-shaped (i.e., mutually perpendicular) n-type diffusion resistors or p-type diffusion resistors has been detected in order to compensate stress (i.e., to compensate influences of mechanical stress). However, precise current mirrors, comparators, amplifiers or analog-to-digital converters (ADCs) are necessary for this.

SUMMARY OF THE INVENTION

An embodiment of the present invention provides a compensating quantity-providing circuit. The compensating quantity-providing circuit includes a frequency signal generator comprising an output for a frequency signal the frequency of which is dependent on mechanical stress in a circuit. Additionally, the compensating quantity-providing circuit includes a compensating quantity provider comprising an input for the frequency signal and an output for a compensating quantity which is based on the frequency signal.

BRIEF DESCRIPTION OF THE DRAWINGS

Embodiments of the present invention will be detailed subsequently referring to the appended drawings, in which.

DETAILED DESCRIPTION OF ILLUSTRATIVE EMBODIMENTS

Figure 1:
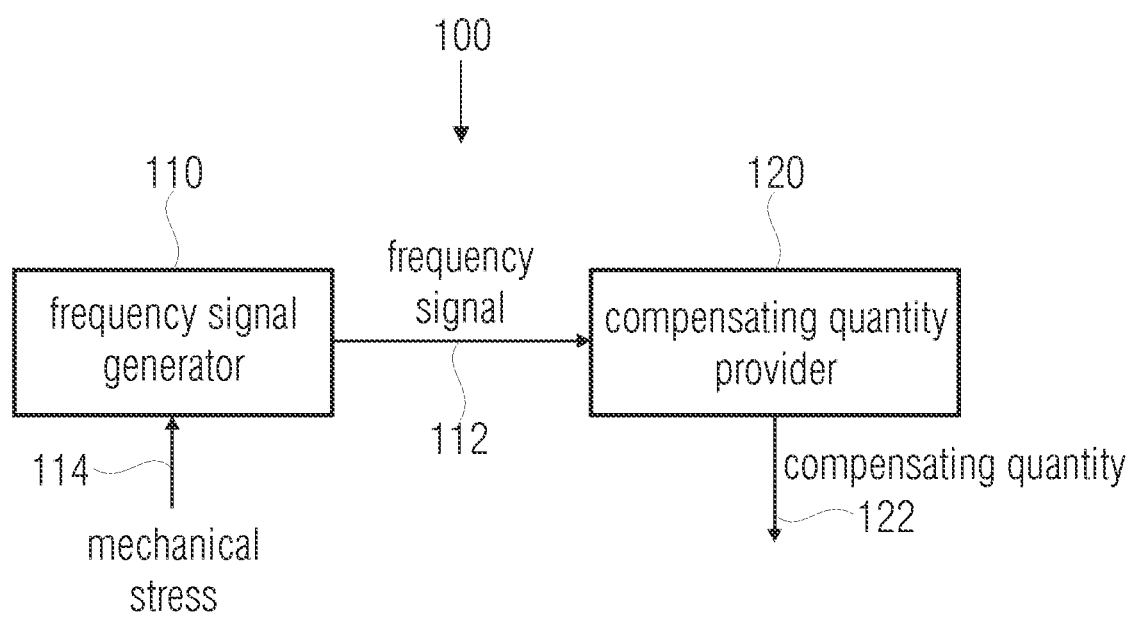
FIG. 1 shows a block circuit diagram of an inventive compensating quantity-providing circuit according to an embodiment of the present invention.

FIG. 1 shows a block circuit diagram of an inventive compensating quantity-providing circuit. The compensating quantity-providing circuit in its entirety is referred to by The compensating quantity-providing circuit 100 includes a frequency signal generator 110 having an output for a frequency signal 112 the frequency of which depends on mechanical stress 114 in a circuit. The compensating quantity-providing circuit 100 additionally includes a compensating quantity provider 120 having an input for the frequency signal 112 and an output for a compensating quantity 122 which is based on the frequency signal 112.

In an embodiment, the compensating quantity allows compensating deviations of an output signal of a circuit (not shown here) caused by mechanical stress.

The compensating quantity-providing circuit 100 thus allows providing a compensating quantity 122 which is a function of the mechanical stress 114 in a manner which is, as far as technology is concerned, particularly easy and reliable to implement.

An important aspect of the present invention is at first transforming the mechanical stress 114 acting on the circuit (not shown) and thus influencing the output signal of the circuit (not shown) into a frequency signal 112. In other words, the frequency signal generator 110 generates the frequency signal 112 such that the frequency of the frequency signal 112 carries information on the mechanical stress 114. The frequency signal 112 represents an intermediate quantity which, as far as technology is concerned, is particularly easy to handle and transfer. In contrast to transmitting voltage signals or current signals, transmitting a frequency signal including information to be evaluated in the form of a frequency does not necessitate highly precise analog circuits. Rather, a frequency of the frequency signal will also be maintained with a (slight) non-linear distortion and in the presence of, for example, drift influences. A frequency signal may typically be distributed well over a semiconductor chip.

Additionally, using the frequency signal 112 is of advantage in that the compensating quantity 122 may exemplarily be provided using a digital circuit. Consequently, it is possible without great uneconomical expenditure to detect the frequency of a frequency signal 112 with high precision using a comparatively simple digital circuit. Thus, the compensating quantity provider 120 is able to detect the frequency of the frequency signal 112 digitally (exemplarily by a frequency counter) and to process the resulting digital value using digital calculating means (such as, for example, adders, subtractors, multipliers, dividers, look-up table evaluators and/or other means), to derive the compensating quantity 122 from the frequency signal 112. In this regard, it is to be pointed out that digital circuits typically consume considerably less chip area than conventionally used analog circuits. Thus, the compensating quantity 122 can be derived from the frequency signal 112 with little circuit area expenditure. Additionally, in many situations, designing and verifying a digital circuit is easier to implement than designing and verifying an analog circuit. Furthermore, a digital circuit is frequently subjected to less severe manufacturing variations than an analog circuit.

If additionally the dependence of the output signal of the useful circuit (not shown), which experiences the mechanical stress 114 as does the frequency signal generator 110, on the mechanical stress is known, it can be ensured by means of a suitable calculating rule in the compensating quantity provider 120 that the compensating quantity 122 provided by the compensating quantity provider 120 is suitable for compensating the dependence of the output signal of the useful circuit (not shown).

When using the frequency signal 122 for describing the mechanical stress 140, the result is a way of compensating the changes in the output signal caused by the mechanical stress 114, wherein, on the one hand, an advantageous distribution of the frequency signal over a semiconductor chip may take place and, on the other hand, digital circuits for generating the compensating quantity 122 from the frequency signal can be used, which is reflected by a decrease in the chip area necessary, a simplified circuit design and increased precision.

Figure 2:
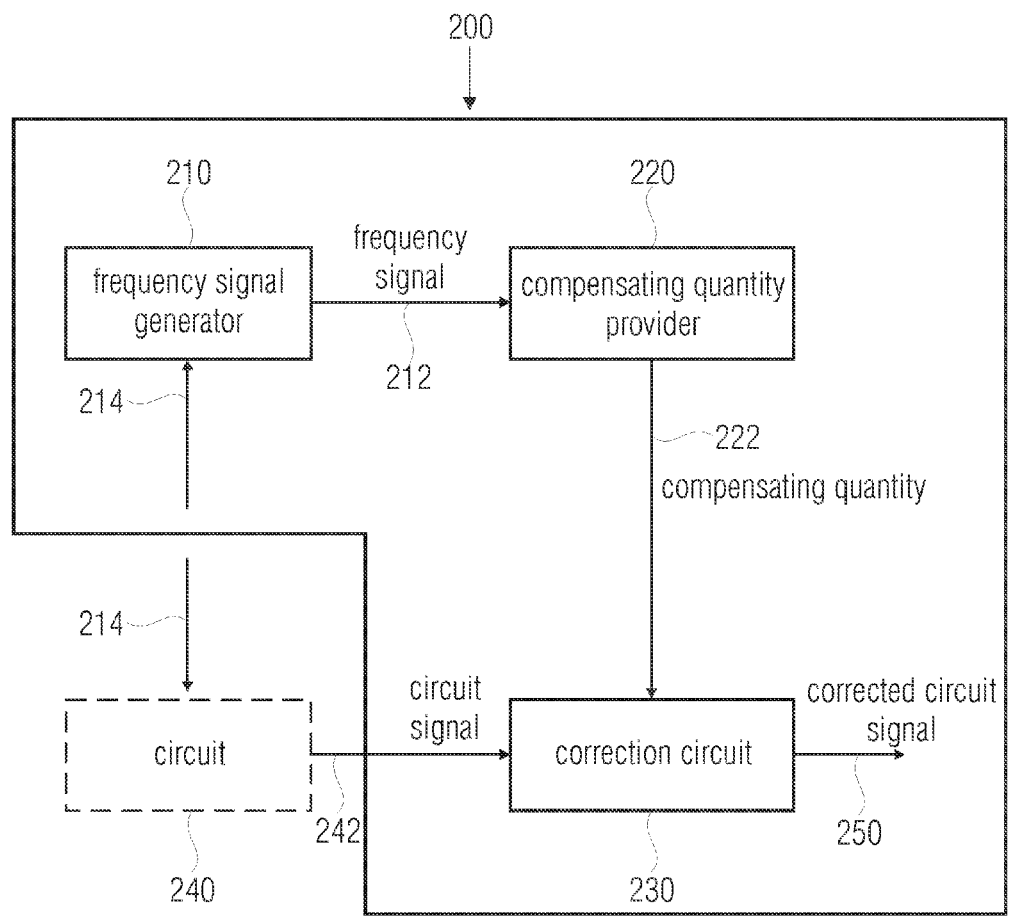
FIG. 2 shows a block circuit diagram of an inventive stress-compensating circuit according to an embodiment of the present invention.

FIG. 2 shows a block circuit diagram of an inventive stress-compensating circuit according to an embodiment of the present invention. The stress-compensating circuit of FIG. 2 in its entirety is referred to by 200. The stress-compensating circuit 200 includes a frequency signal generator 210 which in its function basically corresponds to the frequency signal generator 110. The frequency signal generator 210 provides a frequency signal 212 which basically corresponds to the frequency signal 112 and experiences mechanical stress 214 which basically corresponds to the mechanical stress 114. Additionally, the stress-compensating circuit includes a compensating quantity provider 220 which basically corresponds to the compensating quantity provider 120. The compensating quantity provider 220 provides a compensating quantity 222 which basically corresponds to the compensating quantity 122. In addition to the circuit blocks of the compensating quantity-providing circuit 100, the stress-compensating circuit 200 additionally includes a correction circuit 230. The correction circuit 230 includes an input for the compensating quantity 222.

The block circuit diagram of FIG. 2 additionally shows a circuit or useful circuit 240 which is typically not part of the stress-compensating circuit. The useful circuit 240 comprises an output for a circuit signal or useful-circuit signal 242. The circuit 240 also experiences the mechanical stress 214. In other words, the same mechanical stress 214 (or mechanical stress differing by at most 50% and/or differing by at most 20%) acts on the frequency signal generator 210 and the circuit 240.

The circuit signal or useful circuit signal 242 is also fed to an input of the correction circuit 230. The correction circuit 230 provides a corrected circuit signal 250. The corrected circuit signal 250 carries the same information as the circuit signal 242, however, variations of the circuit signal 242 caused by the mechanical stress 214 are compensated (i.e., decreased compared to the original variations present when not using the correction circuit 230).

In other words, the correction circuit 230 receives the circuit signal 242 and combines it with the compensating quantity 222 using a calculating rule such that the corrected circuit signal 250 has smaller a dependence (exemplarily smaller an absolute dependence or smaller a relative dependence) on the mechanical stress 214 than the circuit signal 242.

When exemplarily a dependence of a frequency of the frequency signal 212 on mechanical stress 214 is known and additionally a dependence of the circuit signal 242 on mechanical stress 214 is known, a rule according to which the compensating quantity provider 220 provides the compensating quantity 222 based on the frequency of the frequency signal 212, and the calculating rule according to which the correction circuit 230 combines the circuit signal 242 and the compensating quantity 222 are selected such that the influence of the mechanical stress on the corrected circuit signal 250 is compensated.

In an embodiment, the circuit 240 and the frequency signal generator 210 are arranged on the same semiconductor chip.

In the embodiment, the circuit 240 is a sensor circuit including a sensor the output signal of which depends on mechanical stress 214. Exemplarily, the circuit 240 may be a sensor circuit including a Hall-effect sensor element. A Hall-effect sensor element exemplarily is a doped region through which a current flows in a first direction, an electrical voltage being measured in a second direction. The characteristics of the Hall-effect sensor element here are exemplarily dependent on the mechanical stress 214, since the Hall-effect sensor element is advantageously on the same semiconductor chip as the frequency signal generator 214 and the rest of the sensor circuit 240.

In another embodiment, the circuit 240 is a temperature-measuring circuit which exemplarily includes a temperature sensor element. The temperature sensor element may exemplarily be a temperature-dependent resistor. The temperature-dependent resistor alters its resistance value in dependence on the mechanical stress 214.

Irrespective of whether the circuit 240 exemplarily is a magnetic field sensor circuit or a temperature sensor circuit, the circuit signal 242 has a dependence on the mechanical stress The corresponding dependence of the circuit signal 242 is counteracted in the correction circuit 232 so that the corrected circuit signal 250 has smaller a dependence on the mechanical stress 214 than the circuit signal 242.

Figure 3:
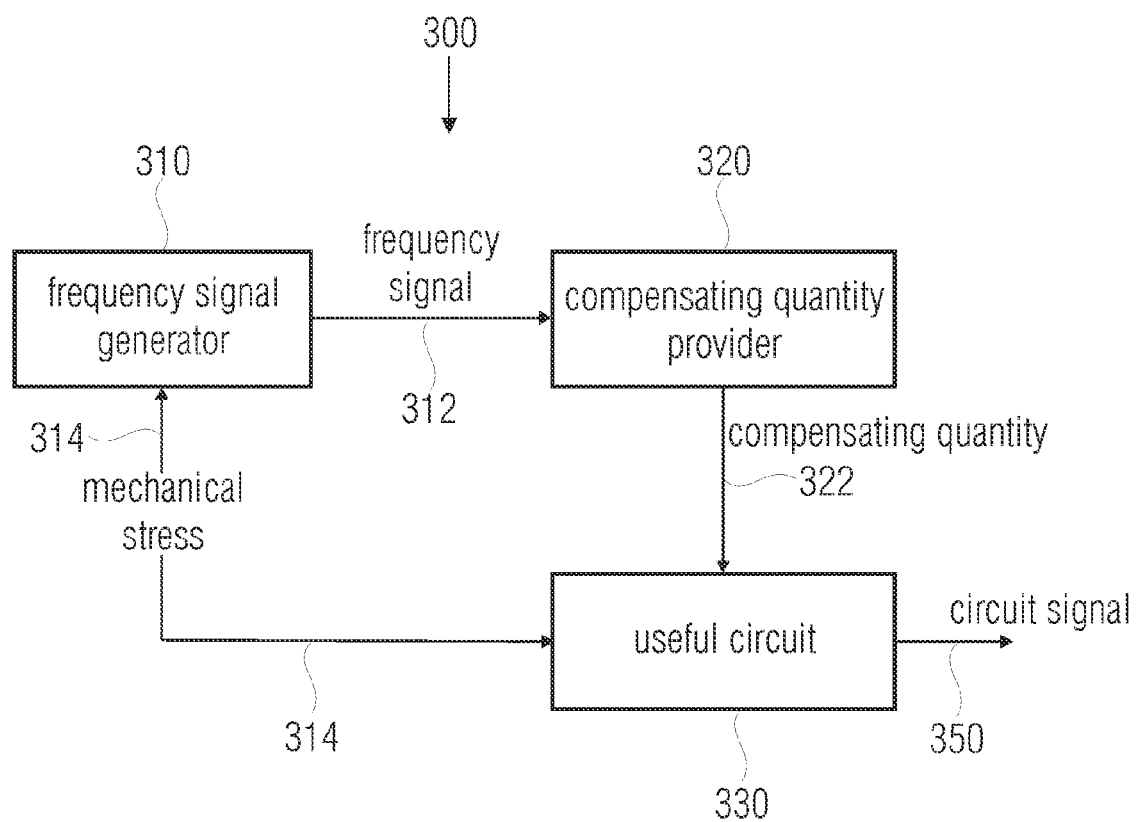
FIG. 3 shows a block circuit diagram of an inventive stress-compensated circuit according to an embodiment of the present invention.

FIG. 3 shows a block circuit diagram of a stress-compensated circuit according to an embodiment of the present invention. The circuit arrangement of FIG. 3 in its entirety is referred to by 300. The circuit arrangement 300 includes a frequency signal generator 310 which basically corresponds to the frequency signal generators 110, 210 of FIGS. 1 and 2. The frequency signal generator 310 provides a frequency signal 312 which basically corresponds to the frequency signals 212, 112. The frequency signal generator 310 additionally experiences mechanical stress 314.

Furthermore, the circuit arrangement 300 includes a compensating quantity provider 320 which basically corresponds to the compensating quantity providers 220, 120. The compensating quantity provider 320 receives the frequency signal 312 and provides a compensating quantity 322 at an output. The compensating quantity 322 basically corresponds to the compensating quantities 222, 122.

The circuit arrangement 300 additionally includes a useful circuit 330. The useful circuit 330 includes an input for the compensating quantity 322 and furthermore experiences the mechanical stress 314. The compensating quantity 322 here represents an input quantity of the useful circuit 330 which exemplarily determines an operating point of the useful circuit 330.

When exemplarily the useful circuit 330 is a sensor circuit, the compensating quantity 322 may exemplarily establish a current flow through a sensor element (such as, for example, through a Hall sensor element and/or a temperature sensor element). However, when the useful circuit 330 is an on-chip oscillator, the compensating quantity 322 may exemplarily cause a frequency of the oscillator to be influenced. Exemplarily, the compensating quantity 322 may influence one or several operating point currents of a ring oscillator. Alternatively, the compensating quantity 322 may act on a frequency-determining element of an oscillating circuit (such as, for example, on a capacitance diode) so as to adjust a frequency of the on-chip oscillator and/or counteract a dependence of the on-chip oscillator frequency on mechanical stress.

When additionally the useful circuit 330 exemplarily is a band gap voltage source, the compensating quantity 322 may exemplarily influence one or several operating point currents.

In summary, it may be stated that FIGS. 2 and 3 describe two concepts of how a corrected circuit signal 250, 350 which is less dependent on the mechanical stress 214, 314 than is the case when using the compensating quantities 222, 322 can be obtained based on the compensating quantities 222, 322 derived from the frequency signals 212, 312.

In the circuit arrangement 200 of FIG. 2, a circuit signal 242 provided by the circuit or useful circuit 240 is corrected afterwards by the correction circuit 230. The circuit signal 242 is exemplarily corrected using a mathematical calculating rule or a look-up table, the correction being dependent on the compensating quantity 222. The correction circuit 230 may exemplarily include digital calculating means.

In contrast, a circuit concept according to FIG. 3 provides a way of directly influencing the generation of the circuit signal 350 (and not only by a correction afterwards). For this purpose, an operating point of the useful circuit 330 is changed in dependence on the compensating quantity such that influence of the mechanical stress 314 on the circuit signal 350 is (at least partly) compensated. In a circuit concept according to FIG. 3, no correction need be performed afterwards.

Figure 4:
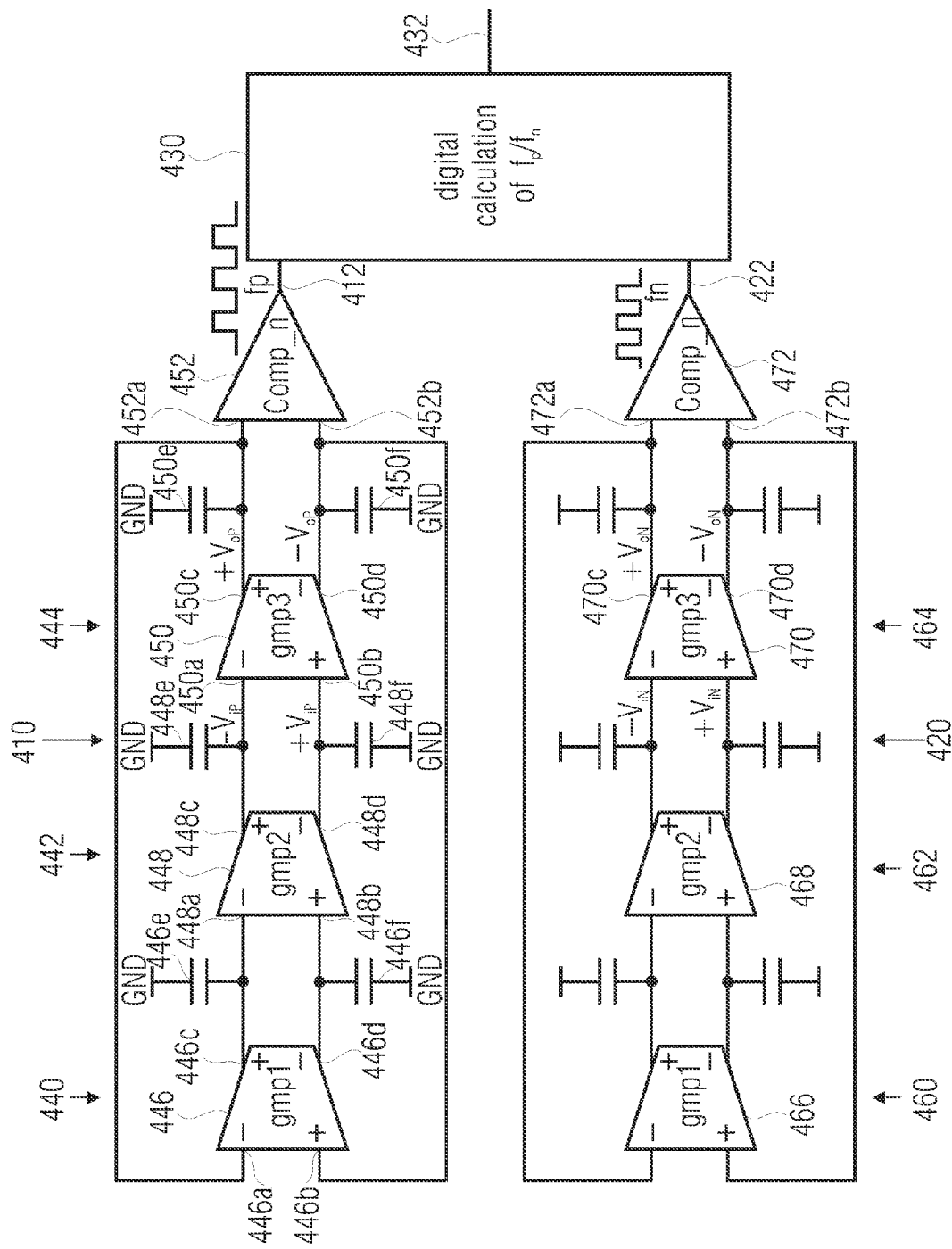
FIG. 4 shows a block circuit diagram of an inventive compensating quantity-providing circuit according to an embodiment of the present invention.

FIG. 4 shows a block circuit diagram of an inventive compensating quantity-providing circuit which may also be taken as a digital sensor for mechanical stress (digital stress sensor). The circuit arrangement of FIG. 4 in its entirety is referred to by 400.

The circuit arrangement 400 includes a first ring oscillator 410 and a second ring oscillator 420. The first ring oscillator 410 provides, at a respective output, a first frequency signal 412 the frequency of which is also referred to as fp. The second ring oscillator 420 provides, at a respective output, a second frequency signal 422 the frequency of which is referred to as fn. The circuit arrangement 400 additionally includes means 430 for digitally calculating a ratio between the frequency fp of the first frequency signal 412 and the frequency fn of the second frequency signal 422. Alternatively, the calculating means 430 may also calculate a difference between the frequency fp of the first frequency signal 412 and the frequency fn of the second frequency signal 422. Additionally, the calculating means 430 may alternatively also calculate a ratio between the frequency fn and the frequency fp.

Furthermore, the means 430 provides, at an output and/or an interface, information on mechanical stress acting on the ring oscillators 410, 420. The information 432 may also be taken as a compensating quantity.

The setup of the first ring oscillator 410 will be described below. The first ring oscillator 410 includes a first stage 440, a second stage 442 and a third stage 444. The first stage 440 includes a differential amplifier 446 comprising a first (inverting) input 446a and a second (non-inverting) input 446b. The differential amplifier 446 additionally includes a first non-inverting output 446c and a first inverting output 446d. A first capacitance 446e is coupled to the first non-inverting output 446c. The first capacitance 446e is additionally coupled to an advantageously fixed potential, exemplarily to a reference potential GND. The second inverting output 446d of the differential amplifier 446 is coupled to a first terminal of a second capacitance 446f, a second terminal of the second capacitance 446f being exemplarily coupled to the reference potential GND. The second stage 442 exemplarily includes a differential amplifier 448. A first inverting input 448a of the second differential amplifier 448 is exemplarily coupled to the first non-inverting output 446c of the first differential amplifier 446. A second non-inverting input 448b is exemplarily coupled to the second inverting output 446d of the first differential amplifier 446. A first non-inverting output 448c of the second differential amplifier 448 is additionally coupled to the first terminal of a third capacitance 448g, a second terminal of the third capacitance 448e being exemplarily coupled to the reference potential GND. A second inverting output 448d of the second differential amplifier 448 is exemplarily coupled to the first terminal of a fourth capacitance 448f, a second terminal of the capacitance 448f being coupled to the reference potential GND.

The third stage 444 exemplarily includes a third differential amplifier 450. A first inverting input 450a of the third differential amplifier 450 is exemplarily coupled to the first non-inverting output 448c of the second differential amplifier 448. A second non-inverting input 450b of the third differential amplifier 450 is exemplarily coupled to the second inverting output 448d of the second differential amplifier 448. A first non-inverting output 450c of the third differential amplifier 450 is coupled to the first terminal of a fifth capacitance 450e, a second terminal of the fifth capacitance 450e being coupled to the reference potential GND. A second inverting output 450d of the third differential amplifier 450 is additionally coupled to a first terminal of a sixth capacitance 450f, a second terminal of the capacitance 450f being coupled to the reference potential GND.

In addition, the first non-inverting output 450c of the third differential amplifier 450 is coupled to the first inverting input 446a of the first differential amplifier 446. The second inverting output 450d of the third differential amplifier 450 is additionally coupled to the second non-inverting input 446b of the first differential amplifier 446.

The first ring oscillator 410 additionally includes a comparator 452. A first input of the comparator 452 is exemplarily coupled to the first non-inverting output 450c of the third differential amplifier 450, whereas a second input 452b of the comparator 450 is coupled to the second inverting output 450d of the third differential amplifier 450. The output of the comparator 452 thus compares the signals at its two inputs 452a, 452b and provides the first frequency signal 412 at its output.

Generally, it may be stated that the first ring oscillator 410 includes at least one, but advantageously at least three inverting stages which are connected in series such that one or several signals are fed back to one or several inputs of a first stage 442, these signals being inverted compared to the original signal applying. The result is a desired instability, and the first ring oscillator oscillates at a frequency which is determined by a propagation speed of the signals through the different stages. The propagation speed thus is essentially determined by the capacitances 446e, 446f, 448e, 448f, 450e, 450f which are coupled to the outputs of the respective stages. Additionally, the propagation speed is determined by the transconductances gm of transistors in the differential amplifiers 446, 448, 450 of the ring oscillator stages 440, 442, 444.

In addition, it is pointed out that advantageously p-channel field-effect transistors are used as differential amplifier input transistors in the ring oscillator stages 440, 442, 444 of the first ring oscillator 410, as will be described in greater detail below. Thus, a transconductance of the p-channel differential amplifier input field-effect transistors (in connection with the capacitances which are assumed to be approximately constant) basically determines the propagation speed of an electrical signal through the stages 440, 442, 444 of the ring oscillator and/or the oscillating frequency of the ring oscillator.

Additionally, it is to be pointed out that the second ring oscillator 420 basically has a parallel setup to the first ring oscillator 410. The second ring oscillator 420 exemplarily includes a first stage 460, a second stage 462 and a third stage 464. The first stage 460 includes a first differential amplifier 466, the second stage includes a second differential amplifier 468, and the third stage 464 includes a third differential amplifier 470. Non-inverting inputs of the differential amplifiers 466, 468, 470 here are characterized by a "+", whereas inverting inputs of the differential amplifiers 466, 468, 470 are characterized by a "−".

Non-inverting outputs of the differential amplifiers 466, 468, 470 are characterized by a "+", whereas inverting outputs of the differential amplifiers 466, 468, 470 are characterized by a "−".

However, it is to be pointed out that there is an essential difference between the first ring oscillator 410 and the second ring oscillator 420. While the input field-effect transistors of the differential amplifiers 446, 448, 450 of the first ring oscillator 410 may be p-channel field-effect transistors, input field-effect transistors of the differential amplifiers 466, 468, 470 of the second ring oscillator 420 may be n-channel field-effect transistors.

Put generally, it is of advantage for the input field-effect transistors of at least one differential amplifier 446, 448, 450 of the first ring oscillator 410 to comprise a different channel type than input field-effect transistors of at least one differential amplifier 466, 468, 470.

The second ring oscillator 420 additionally includes a comparator 472 the inputs 472a, 472b of which are coupled to outputs 470c, 470d of the third differential amplifier 470. The comparator 472 additionally provides the second frequency signal 422 at its output.

Based on the above structural description, the mode of functioning of the circuit arrangement 400 will be described below. The circuit arrangement 400 includes two ring oscillators 410, 420 whose frequency signals 412, 422 have different frequency dependences on mechanical stress due to the different selection of the input transistors of the differential amplifiers 446, 448, 450 and 466, 468, 470, respectively. In an embodiment, the two ring oscillators 410, 420 may be arranged on the same semiconductor chip.

Additionally, the two ring oscillators 410, 420 are advantageously (but not necessarily) arranged next to each other so that the two ring oscillators 410, 420 exhibit at least approximately the same mechanical stress in the semiconductor chip. In this regard, it is to be mentioned that a transconductance gm or mutual conductance gm of n-channel field-effect transistors has a different dependence on mechanical stress than a transconductance gm or mutual conductance gm of p-channel field-effect transistors. Thus, in the presence of mechanical stress, the frequency of the first frequency signal 412 provided by the first ring oscillator 410 changes in a different manner to the frequency of the second frequency signal 422 provided by the second ring oscillator 422. Thus, the means 430 may conclude, by determining a ratio between the frequency fp of the first frequency signal 412 and the frequency fn of the second frequency signal 422, to the mechanical stress acting on the ring oscillators 410, 420. Alternatively, the means 430 may also evaluate a difference between the frequencies fp and fn and thus again conclude to the mechanical stress infiltrating the ring oscillators 410, 420.

Due to the frequencies fp and fn, the means 430 has at its disposal information on mechanical stress and thus is able to exemplarily determine as output quantity a compensating quantity which is suitable for correcting an output signal of another circuit arrangement (exemplarily of a Hall sensor circuit or a temperature sensor circuit). The output signal of the means 430, however, may also serve as a measuring value for the mechanical stress.

Different methods of how a frequency dependence of the ring oscillators relative to mechanical stress can be optimized will be described below.

Figure 5:
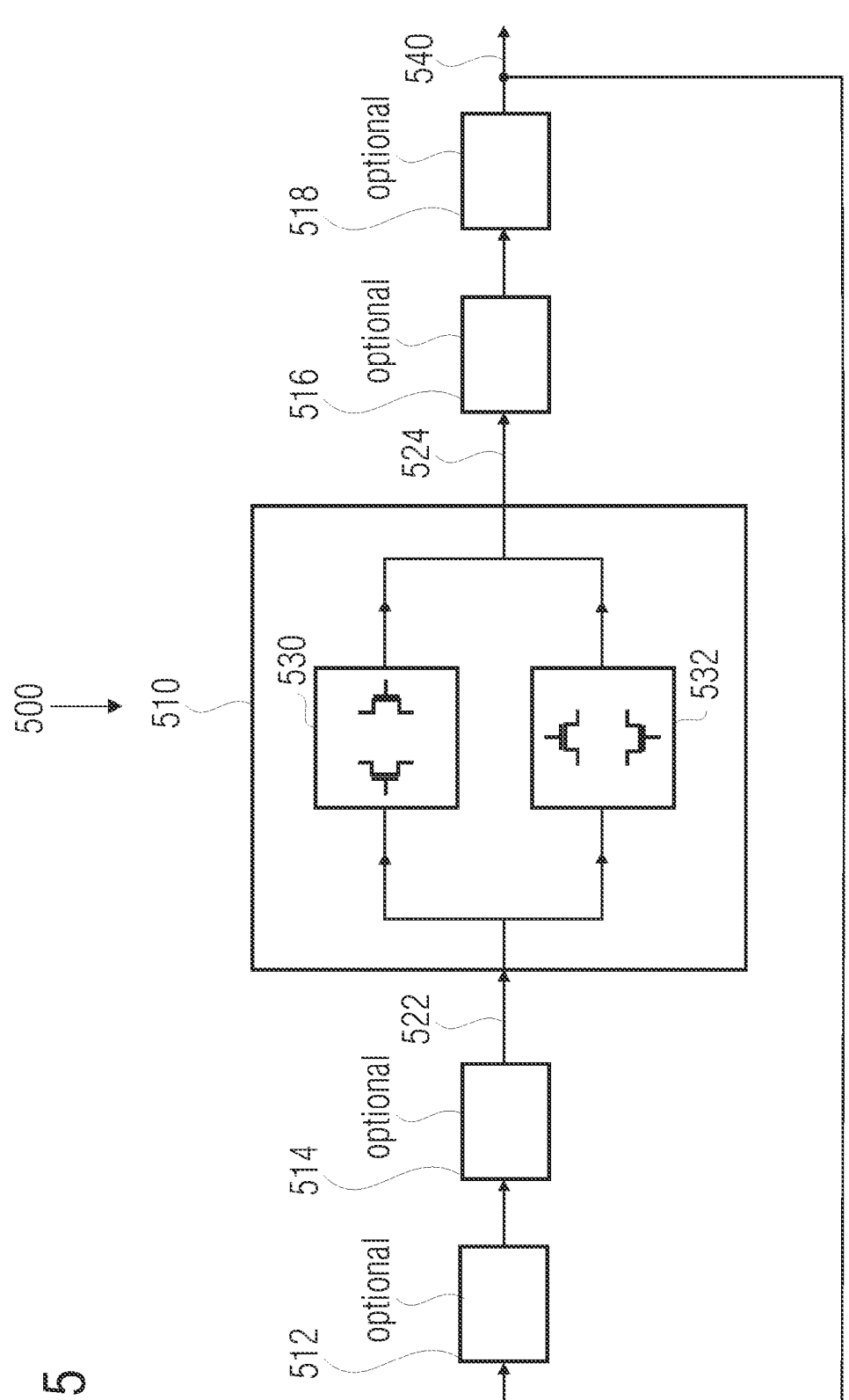
FIG. 5 shows a block circuit diagram of an inventive ring oscillator comprising a ring oscillator stage having two differential amplifiers connected in parallel according to an embodiment of the present invention.

In this regard, FIG. 5 shows a block circuit diagram of an inventive ring oscillator comprising a differential amplifier stage having two differential amplifiers connected in parallel according to an embodiment of the present invention. The circuit arrangement of FIG. 5 in its entirety is referred to by 500. The ring oscillator 500 includes at least one ring oscillator stage 510. Optionally, the ring oscillator 500 may also include further ring oscillator stages 512, 514, 516, 518. The ring oscillator stages may be connected together to form a feedback ring so that the result is inverted feedback including an oscillating ring oscillator 500. The ring oscillator 500 thus includes at least one inverting stage.

One stage 510 of the ring oscillator includes an input for an oscillator stage input signal 522 and an output for an oscillator stage output signal 524 which is inverted compared to the oscillator stage input signal. Additionally, the ring oscillator stage 510 includes a parallel connection of a first differential amplifier 530 and a second differential amplifier 532. The first differential amplifier 530 includes a first pair of input field-effect transistors and the second differential amplifier 532 includes a second pair of input field-effect transistors. A channel direction of a field-effect transistor of the first pair of input field-effect transistors encloses an angle in a range between 60 degrees and 120 degrees with a channel direction of a field-effect transistor of the second pair of input field-effect transistors. The ring oscillator 500 additionally includes an output for a ring oscillator output signal 540 the frequency of which is based on a frequency of the oscillator stage output signal 524.

The mode of functioning of the ring oscillator 500 will be discussed in greater detail below based on the structural description of the ring oscillator 500. The ring oscillator stage 510 includes a parallel connection of two differential amplifiers the input transistors of which have different alignments. In this regard, it should be mentioned that a change in a transconductance of a field-effect transistors depends on a direction of mechanical stress infiltrating the field-effect transistor. When exemplarily the two input transistors of the first differential amplifier 530 have an orientation along a first direction, the transconductance of the input transistors of the first differential amplifier 530 basically depends on mechanical stress in a first direction of stress. In addition, when the input field-effect transistors of the second differential amplifier 532 are oriented in a second direction which differs from the first direction, a transconductance of the input field-effect transistors of the second differential amplifier 532 basically depends on mechanical stress in a second direction of stress.

It is well known how a direction-independent in-plane stress dependence, which is independent on the direction of stress, is achieved in 100-wafers. This is achieved by connecting mutually perpendicular resistors in parallel. Corresponding arrangements of MOS transistors also have a direction-independent stress sensitivity.

When the input field-effect transistors of the first differential amplifier 530 and the second differential amplifier 532 are oriented to be nearly perpendicular to each other (and/or enclose an angle in a range between 60 degrees and 120 degrees), with a certain direction of mechanical stress, at least a respective one of the two differential amplifiers 530, 532 will be sensitive to mechanical stress.

By an input-side and output-side parallel connection of the two differential amplifiers 530, 532, a dependence of the overall amplification of the parallel connection on a direction of the mechanical stress is reduced compared to an arrangement comprising only one differential amplifier. Thus, an amplification of the ring oscillator stage 510 and/or an effective transconductance of the ring oscillator stage 510 are considerably less dependent on a direction of mechanical stress than would be the case in a ring oscillator stage comprising only a single differential amplifier.

Figure 6:
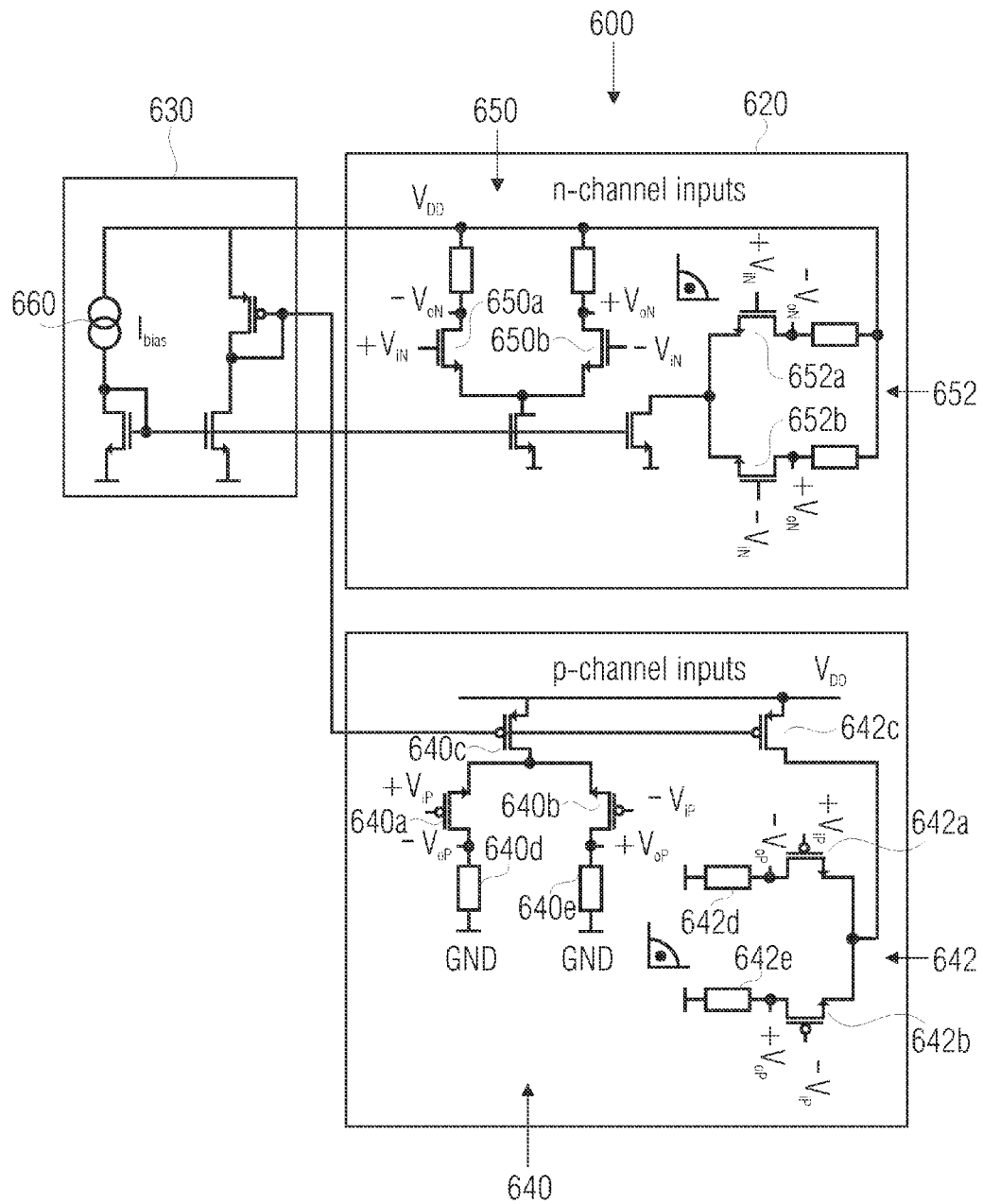
FIG. 6 shows a portion of a circuit diagram of an inventive double-ring oscillator according to an embodiment of the present invention.

FIG. 6 shows a portion of a detailed circuit diagram of an inventive ring oscillator according to an embodiment of the present invention. The circuit arrangement of FIG. 6 in its entirety is referred to by 600. The circuit arrangement 600 includes a first ring oscillator stage 610 and a second ring oscillator stage 620. In addition, the circuit arrangement 600 includes a common operating point current source 630 providing operating point currents for the first ring oscillator stage 610 and for the second ring oscillator stage 620.

It is to be pointed out that the first ring oscillator stage 610 may exemplarily substitute a differential amplifier 446, 448, 450 of the first ring oscillator 410. In addition, the second ring oscillator stage 620 may exemplarily substitute the differential amplifier 466, the differential amplifier 468 or the differential amplifier 470 of the second ring oscillator 420.

The first ring oscillator stage 610 exemplarily includes a parallel connection of a first differential amplifier 640 and a second differential amplifier 642. The first differential amplifier 640 exemplarily includes a first p-channel field-effect transistor 640a and a second p-channel field-effect transistor 640b as input transistors. Source terminals of the two p-channel field-effect transistors 640a, 640b are exemplarily coupled to each other and additionally coupled to a supply potential feed for a supply potential VDD via a low-end or base-end or base current source transistor 640c.

A drain terminal of the first p-channel field-effect transistor 640a is additionally coupled to a reference potential feed for a reference potential GND via a load (such as, for example, a resistor) or a load 640d formed differently and having the highest resistance possible which may also include a cascode. Similarly, a drain terminal of the second p-channel field-effect transistor 640b is coupled to the reference potential GND via a load circuit 640e. The first ring oscillator stage 610 additionally includes a second differential amplifier 642. The second differential amplifier 642 includes, as input transistors, a third p-channel field-effect transistor 642a and a fourth p-channel field-effect transistor 642b. Source terminals of the third p-channel field-effect transistor 642a and the fourth p-channel field-effect transistor 642b are coupled to each other. Additionally, the source terminals of the third p-channel field-effect transistor 642a and the fourth p-channel field-effect transistor 642b are coupled to the supply potential feed for a supply potential VDD via a low-end current source transistor 642c.

A drain terminal of the third p-channel field-effect transistor 642b is additionally coupled to a reference potential GND via a respective load circuit 642d and a drain terminal of the fourth p-channel field-effect transistor 642b is coupled to the reference potential GND via a load circuit 642e. Additionally, it is to be pointed out that in an embodiment a channel of the first p-channel field-effect transistor 640a is essentially arranged in parallel to a channel of the second p-channel field-effect transistor 640b. "Essentially parallel" here means an angular deviation of the channel directions of at most 30 degrees. In addition, in an embodiment, a channel of the third p-channel field-effect transistor 642a is essentially parallel to a channel of the fourth p-channel field-effect transistor 642b.

Additionally, in an embodiment a channel of the first p-channel field-effect transistor 640a is essentially perpendicular to a channel of the third p-channel field-effect transistor 642a. In other words, a direction (such as, for example, a main current flow direction) of the channel of the first p-channel field-effect transistor 640a encloses an angle in a range between 60 degrees and 120 degrees with a direction of the channel of the third p-channel field-effect transistor. Similarly, a direction of the channel of the second p-channel field-effect transistor 640b encloses an angle in a range between 60 degrees and 120 degrees with a direction of the channel of the fourth p-channel field-effect transistor 642b.

Additionally, it is to be pointed out that the first differential amplifier 640 and the second differential amplifier 642 are connected in parallel both on the input side and the output side. Exemplarily, a gate terminal of the first p-channel field-effect transistor 640a is coupled to a gate terminal of the third p-channel field-effect transistor 642a directly or via a coupling network which exemplarily includes one or several resistors, one or several potential-shifting means and/or one or several pre-amplifiers.

In a simple embodiment, there may be a direct conductive connection between the gate terminals of the first p-channel field-effect transistor 640a and the third p-channel field-effect transistor 642a, for example.

Similarly, gate terminals of the second p-channel field-effect transistor 640b and the fourth p-channel field-effect transistor 642b are coupled to each other directly or via coupling means.

Furthermore, load circuits of the first p-channel field-effect transistor 640a and the third p-channel field-effect transistor 642a are coupled to each other directly or via a coupling network. In the easiest case, drain terminals of the first p-channel field-effect transistor 640a and the third p-channel field-effect transistor 642a are connected to each other in a conductive manner. However, when load networks 640d, 642d having several nodes are coupled to the first p-channel field-effect transistor 640a and the third p-channel field-effect transistor 642a, two nodes of the load networks 640d, 642d may be coupled directly or via a coupling network. When, for example, the load networks 640d, 642d include cascode connections, the nodes buffered by the cascodes may exemplarily be coupled to each other.

Similarly, the second p-channel field-effect transistor 640b and the fourth p-channel field-effect transistor 642b are coupled to each other at the load side. Exemplarily, a drain terminal of the second p-channel field-effect transistor 640b may be coupled to a drain terminal of the fourth p-channel field-effect transistor 642b directly (via a direct conductive connection) or via a coupling network. However, the coupling may also be done via a node of the load networks 640e, 642e, as has been discussed before.

Additionally, it is to be pointed out that the second ring oscillator stage 620 in an embodiment has a complementary setup to the first ring oscillator stage 610. The second ring oscillator stage 620 includes a first differential amplifier 650 having n-channel field-effect transistors 650a, 650b as input transistors. Additionally, the second ring oscillator stage 620 includes a second differential amplifier 652 which includes, as input transistors, a third n-channel field-effect transistor 652a and a fourth n-channel field-effect transistor 652b. Furthermore, the differential amplifier 650 and the differential amplifier 652 are also connected in parallel, similarly to what has been described for the differential amplifiers 640, 642. Furthermore, the third n-channel field-effect transistor 652a is twisted by about 90 degrees (and/or in a range between 60 degrees and 120 degrees) compared to the first n-channel field-effect transistor 650a. Additionally, the fourth n-channel field-effect transistor 652b is twisted by around 90 degrees (in a range between 60 degrees and 120 degrees) compared to the second n-channel field-effect transistor 650b.

Additionally, it is to be mentioned that the first differential amplifier 640 and the second differential amplifier 642 in an embodiment are fed by the same low-end currents; however, in an embodiment of the present invention, the low-end current source transistors 640c, 642c have nearly the same orientation (and/or are twisted by at most 30 degrees).

It is also to be pointed out that low-end currents for the two differential amplifiers 640, 642 and for the two differential amplifiers 650, 652 in an embodiment are derived from a single reference current source 660. In an embodiment, the low-end current fed to the first differential amplifier 640 of the first ring oscillator stage 610 is derived by one or several current mirrors from the current Ibias of the reference current source 660. Similarly, the low-end current for the second differential amplifier 642 of the first ring oscillator stage 610 is derived from the current Ibias by one or several current mirrors. In addition, a low-end current of the first differential amplifier 650 of the second ring oscillator stage 620 is derived from the current Ibias by one or several current mirrors, as is a low-end current of the second differential amplifier 652 of the second ring oscillator stage 620. The structure of a suitable current mirror circuit may, for example, be taken from FIG. 6.

The present invention may be summarized as follows referring to FIGS. 4, 5 and 6:

Two different ring oscillators 610, 620 implemented in Gm-C technology are used, advantageously in the center of a chip (like for example of a semiconductor chip) (compare FIG. 4). A ring oscillator implemented in Gm-C technology here is meant to be a ring oscillator the oscillating frequency of which is essentially determined by a transconductance gm of field-effect transistors in (advantageously inverting) amplifier stages of the ring oscillator and by capacitances coupled to the outputs of the amplifier stages. The first ring oscillator, like for example the ring oscillator 410, comprises a p-channel differential input stage, whereas the second ring oscillator, like for example the ring oscillator 420, comprises an n-channel differential input stage (compare, for example, the ring oscillator stages 610, 620 of FIG. 6).

Two digital frequency signals 412, 422 having frequencies fn and fp are provided to a digital evaluating circuit (like for example means 430) via two comparators 452, 472 (compare FIG. 4). The digital evaluating circuit 430 establishes a ratio or a difference of the two frequencies fn, fp. With (mechanical) stress in the direction of the chip plane (exemplarily of the semiconductor chip), like for example bending in a plastic package caused by a change in humidity, the frequencies change differently, since the n-channel inputs cause a different change in transconductance in the case of mechanical stress than p-channel inputs. It is to be pointed out that stress in the direction of the chip plane is also referred to as in-plane stress change. Transconductance here is meant to be the mutual conductance gm of the transistors. The following applies:

$$\text{transconductance} = Gm = \Delta I_{out}/\Delta V_{in},$$

$\Delta I_{out}$ describing a change in output current of an amplifier (or drain current Id of a field-effect transistor), and $\Delta V_{in}$ describing a change in input voltage of an amplifier (or a gate-source voltage of a field-effect transistor).

The different change in transconductance and/or the resulting different change in frequency are achieved by different piezoresistive coefficients in a channel for n-channel MOS and p-channel MOS. However, the field of application of the present invention is not limited to MOS transistors, but is also suitable for being applied with other types of field-effect transistors (like for example MESFTES).

The article "Piezoresistive Characteristics of short-Channel MOSFETs on (100) Silicon" by Arthur T. Bradley, Richard C. Jaeger, Jeffrey C. Suhling and Kevin J. O'Conner, published in IEEE Transactions on Electron Devices, vol. 48, no. 9, September 2001, pages 2009 ff., teaches that a stress-dependent mobility in an MOS channel corresponds to a piezoresistive effect in diffused resistors.

Conventional n-type and p-type diffusion resistors arranged at right angles, in a 100 material (i.e., exemplarily in (100) silicon material), have a piezoresistive effect, the piezoresistive effect taking the following value:

$$\text{for p: } (\pi_{11}+\pi_{12})/2=2.75\%/\text{Gpa};$$

$$\text{for n: } (\pi_{11}+\pi_{12})/2=-22.4\%/\text{Gpa}.$$

The stress-dependent mobility constants $\mu n$ and $\mu p$ in MOS transistors behave in a similarly differing manner.

Due to the arrangement at right angles and parallel connection of two input stages as has exemplarily been described referring to FIGS. 5 and 6, a change in $\mu$ can be made to be independent on the direction of stress in the chip plane (in-plane stress measurement; compare US 2005/0162160). The different change in the oscillating frequency (of the ring oscillators 410, 420)

$$f \sim gm/C$$

is caused by the different change in transconductance (Gm). The following applies:

$$gm = 2\sqrt{\frac{\mu C_{ox}}{2n}\frac{W}{L}I_D}$$

µ describes a mobility constant in MOS transistors, n a sub-threshold factor, W a width of the MOS transistor (and/or the channel thereof), L a length of the MOS transistor (and/or the channel thereof), and ID a drain current of the transistor.

Since the mobility constant µ=f(σ) is a function of stress, gm and thus the oscillator frequency change with changing stress, but in different ways in the two oscillators.

Consequently, the following applies:

$$fn \sim \sqrt{1+\pi_n(\sigma_{xx}+\sigma_{yy})}$$

Additionally, the following applies:

$$fp \sim \sqrt{1+\pi_p(\sigma_{xx}+\sigma_{yy})}$$

$\pi_n$ and $\pi_p$ describe an effective piezoelectric constant, $\sigma_{xx}$ (mechanical) stress in a first direction (x direction) and $\sigma_{yy}$ (mechanical) stress in a second direction (y direction). The different change in frequencies fn, fp is evaluated in the digital evaluating circuit 430.

Furthermore, it is also possible to only design one of the ring oscillators 410, 420 and/or only one of the ring oscillator stages 440, 442, 444; 460, 462, 470 to be stress-dependent and to leave and/or design the remaining ones to be stress-insensitive.

Thus, the present concept results in the advantage that the ring oscillators 410, 420 and the digital evaluating circuit 430 together consume smaller an area than an analog circuit arrangement used conventionally for stress compensation.

Furthermore, it is to be pointed out that in an embodiment both ring oscillators 410, 420 are controlled by a common bias circuit. This common bias circuit may, for example, include a simple current source including a current mirror, as is shown in FIG. 6 (compare operating point-adjusting circuit 630 and low-end current source transistors 640c, 642c).

Thus, the frequencies of the two oscillators have a similar temperature dependence (compare FIG. 6). Since µn and µp have similar temperature coefficients (~−5000 ppm/K), the result is a relatively small temperature dependence of the digital output signal. However, the expenditure of known temperature compensation solutions is very high.

Figure 7:
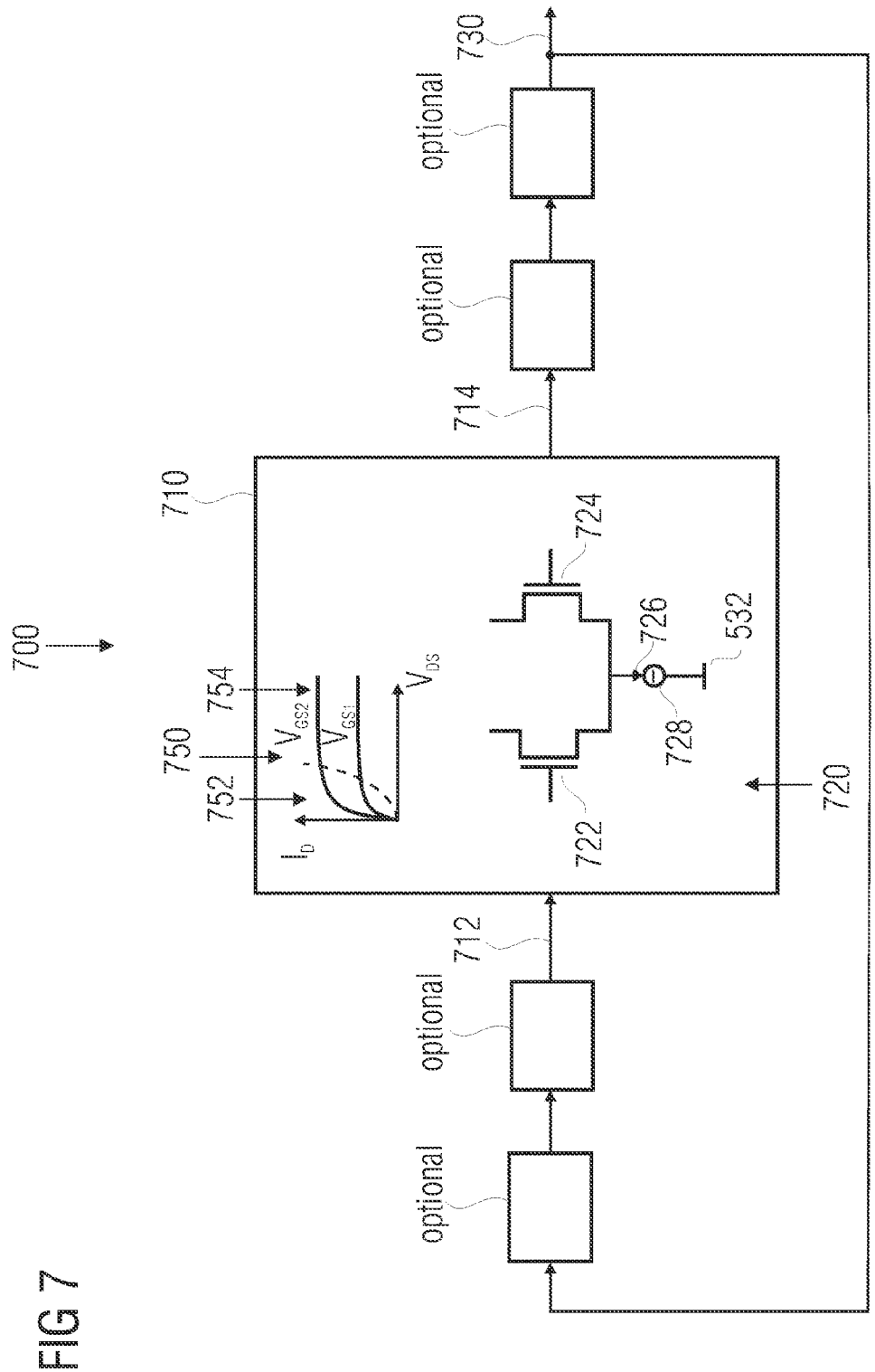
FIG. 7 shows a block circuit diagram of an inventive ring oscillator comprising a ring oscillator stage having a differential amplifier the input field-effect transistor of which is operated in a triode region according to an embodiment of the present invention.

FIG. 7 shows a block circuit diagram of an inventive ring oscillator where input transistors of a differential amplifier are operated in a triode region according to an embodiment of the present invention. The ring oscillator of FIG. 7 in its entirety is referred to by 700.

The ring oscillator 700 includes a ring oscillator stage 710 comprising an input for an oscillator stage input signal 712 and an output for an oscillator stage output signal 714 which is inverted compared to the oscillator stage input signal. The ring oscillator stage 710 includes a differential amplifier 720 comprising an input for the oscillator stage input signal 712 and an output for the oscillator stage output signal 714. The differential amplifier 720 includes a pair of input field-effect transistors 722, 724 which are operated by an operating point current 726 in a triode region. The differential amplifier comprises an operating point current-adjusting circuit 728 providing an operating point current 726. In addition, the ring oscillator includes an output for a ring oscillator output signal 730 the frequency of which is based on a frequency of the oscillator stage output signal 714.

A triode region of the field-effect transistors 722, 724 here is meant to be an operating point of the field-effect transistors 722, 724 in an output characteristic curve field which is typically also referred to as linear range and/or ohmic range. In other words, there is no saturation in the triode region of the field-effect transistors 722, 724. Furthermore, it is to be pointed out that the triode region in an output characteristic curve field 750 of an n-channel field-effect transistor is referred to by 752 and delineated by a broken line from a saturation region 754 in the characteristic curve field 750. A definition of the triode region is additionally to be found in the standard handbook "Halbleiter-Schaltungstechnik" by U. Tietze and Ch. Schenk.

Additionally, it is to be pointed out that an n-channel field-effect transistor is in the triode region when the following is true: 0≦UDS<UGS−Uth, UDS referring to a drain-source voltage of the n-channel field-effect transistor, UGS referring to a gate-source voltage of the n-channel field-effect transistor, and Uth referring to a threshold voltage of the n-channel field-effect transistor. Those skilled in the art will also know a corresponding definition for the p-channel field-effect transistor.

A corresponding circuit arrangement is of advantage, since when operating in the triode region, the mobilities µn, µp have a particularly strong influence on the drain current, as will be described in greater detail below. Thus, operating the input transistors of the differential amplifiers in the triode region entails a particularly strong dependence of the transconductance gm, and thus the frequency fn, fp on mechanical stress.

Figure 8:
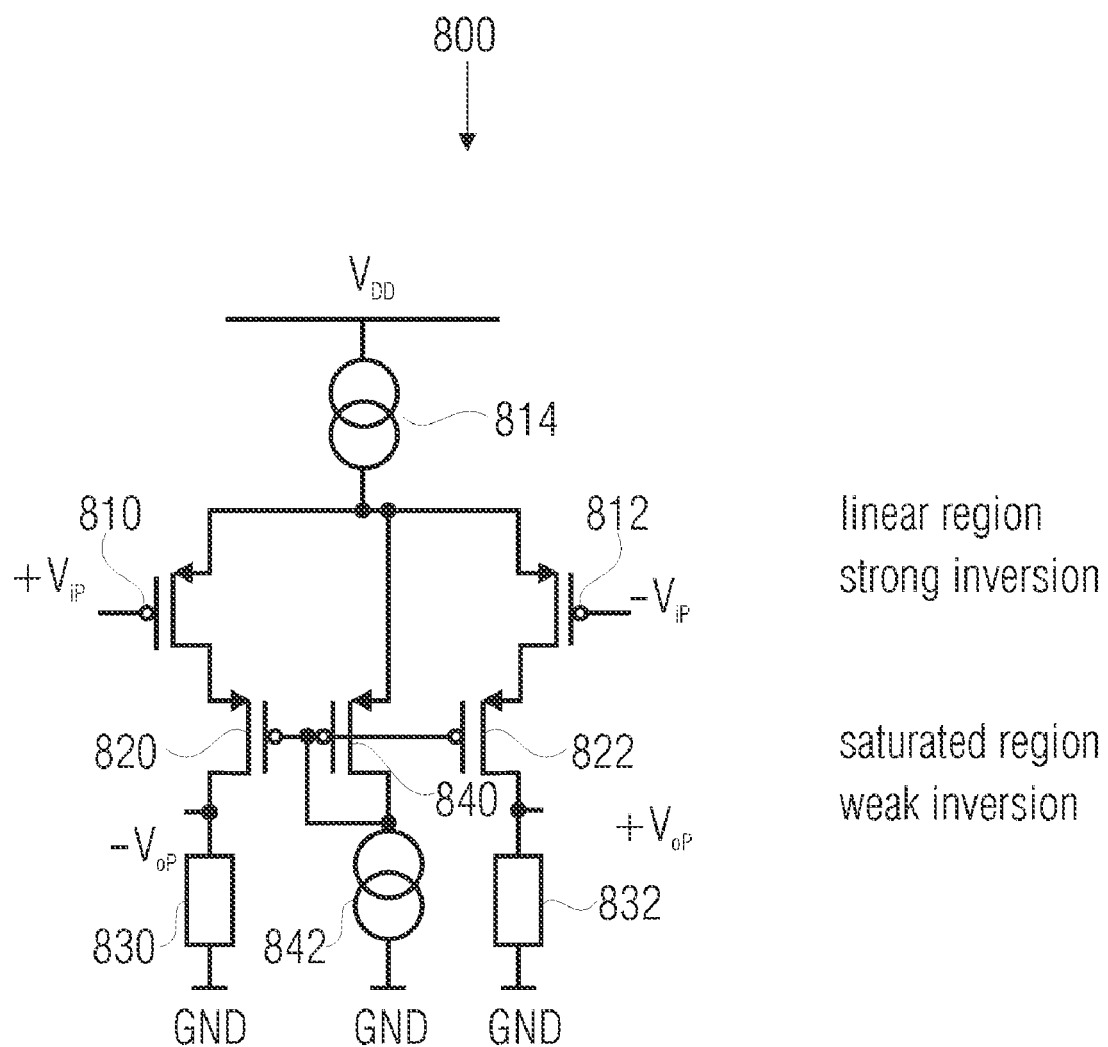
FIG. 8 shows a circuit diagram of an inventive differential amplifier where input field-effect transistors are operated in a triode region according to an embodiment of the present invention.

FIG. 8 shows a circuit diagram of an inventive differential amplifier for being used in an inventive ring oscillator according to an embodiment of the present invention. The circuit arrangement of FIG. 8 in its entirety is referred to by 800. The differential amplifier 800 includes a first p-channel input field-effect transistor 810 and a second p-channel input field-effect transistor 812. A source terminal of the first p-channel input field-effect transistor 810 is coupled to a source terminal of the second p-channel input field-effect transistor 812. In addition, the source terminals of the first p-channel input field-effect transistor 810 and the second p-channel input field-effect transistor 812 are coupled to a supply potential feed for a supply potential VDD via a low-end current source 814.

The circuit arrangement 800 additionally includes a first p-channel cascode field-effect transistor 820 and a second p-channel cascode field-effect transistor 822. A channel of the first p-channel cascode field-effect transistor 820 is connected in series to a channel of the first p-channel input field-effect transistor 810. In other words, a drain terminal of the first p-channel input field-effect transistor 810 is coupled to a source terminal of the first p-channel cascode field-effect transistor 820. A channel of the second p-channel cascode field-effect transistor 820 is connected in series to a channel of the second p-channel input field-effect transistor 812. In other words, a drain terminal of the second p-channel input field-effect transistor 812 is coupled to a source terminal of the second p-channel cascode field-effect transistor 822.

A drain terminal of the first p-channel cascode field-effect transistor 820 is additionally coupled to a reference potential GND via a load circuit 830. A drain terminal of the second p-channel cascode field-effect transistor 822 is additionally coupled to the reference potential GND via a second load circuit 832.

The differential amplifier 800 additionally includes a cascode gate potential providing transistor 840. The cascode gate potential providing transistor 840 may be a p-channel field-effect transistor. A source terminal of the cascode gate potential providing transistor 840 is advantageously coupled to source terminals of the first p-channel input field-effect transistor 810 and the second p-channel input field-effect transistor 812. In addition, a gate terminal of the cascode gate potential providing transistor 840 is coupled to gate terminals of the first p-channel cascode field-effect transistor 820 and the second p-channel cascode field-effect transistor 822. In addition, a drain terminal of the cascode gate potential providing transistor 840 is advantageously coupled to a gate terminal thereof. The drain terminal of the cascode gate potential providing transistor 840 is additionally coupled to a respective current source 842 which is connected between the drain terminal of the cascode gate potential providing transistor 840 and the reference potential GND.

It is to be pointed out that the gate terminals of the p-channel input field-effect transistors 810, 812 serve as inputs of the differential amplifier 800 and that additionally drain terminals of the p-channel cascode field-effect transistors 820, 822 may serve as outputs of the differential amplifier 800.

Additionally, it is to be pointed out that in an embodiment of the present invention the operating points are adjusted (using the current sources 840, 842) such that the first p-channel input field-effect transistor 810 is operated in a linear region (triode region) and that additionally the second p-channel input field-effect transistor 812 is also operated in a linear region (triode region). Furthermore, the first p-channel cascode field-effect transistor 820 and the second p-channel cascode field-effect transistor 822 are operated in a saturation region. It is to be pointed out that advantageously the operating points of the circuit are designed such that the field-effect transistors 810 and 812 are operated in strong inversion, whereas the p-channel cascode field-effect transistors 820 and 822 are operated in weak inversion.

Additionally, it is to be pointed out that in an embodiment the cascode gate potential providing transistor 840 is also operated in a saturation region and in weak inversion.

Additionally, it is to be pointed out that the differential amplifier 800 may exemplarily be used instead of the differential amplifiers 446, 448, 450, 466, 468, 470. Furthermore, it is to be pointed out that the differential amplifier 800 may exemplarily replace the differential amplifier 640 and/or the differential amplifier 642.

It is also to be pointed out that of course a differential amplifier complementary to the differential amplifier 800 may be used, wherein p-channel field-effect transistors are replaced by n-channel field-effect transistors and the polarities of the supply potentials VDD, GND are exchanged.

A circuit complementary to the differential amplifier 800 may thus exemplarily replace the differential amplifier 650 and/or the differential amplifier 652. In other words, two differential amplifiers having a setup according to FIG. 8 may be connected in parallel, wherein the input transistors of two differential amplifiers 800 connected in parallel are twisted to each other by about 90 degrees (in a range between 60 degrees and 120 degrees).

Thus, it can be stated that FIG. 8 shows a particularly advantageous transconductance stage (differential amplifier) comprising input transistors 810, 812 operated in the linear region.

In other words, FIG. 8 shows a transconductance stage comprising a p-channel input (input transistors 810, 812) and cascode stages (p-channel cascode field-effect transistors) 820, A bias transistor or operating point-adjusting transistor 840 generates a bias voltage (a gate potential) for the cascode stages (i.e., for the p-channel cascode field-effect transistors 820, 822), so that the input transistors or p-channel input field-effect transistors 810, 812 are operated in a linear region, and not in a saturated or saturation region, as is conventional, in order to achieve high amplifications.

This is achieved by operating the input transistors (i.e., the p-channel input field-effect transistors 810, 812) far in a region of strong inversion (high VGS–Vth) and by operating the bias transistor 840 at low VGS–Vth (weak inversion). In other words, the operating point of the p-channel input field-effect transistors 810, 812 is set by the p-channel cascode field-effect transistors 820, 822, by the bias transistor 840 and additionally by the low-end current source 814 such that exemplarily a magnitude of a difference between a gate-source voltage VGS and a threshold voltage Vth of the first p-channel input field-effect transistor 810 is greater than a magnitude of a difference between a gate-source voltage VGS and a threshold voltage Vth of the bias field-effect transistor 840. Consequently, the input transistors or p-channel input field-effect transistors 810, 812 may be operated at such an operating point where a drain-source voltage VDS is (as far as magnitude is concerned) smaller than a difference between a gate-source voltage VGS and a threshold voltage Vth. In other words, the input transistors are operated at smaller a VDS voltage compared to the VGS–Vth voltage thereof. In other words, the p-channel input field-effect transistors 810, 812 are operated in a linear region instead of, as is conventional, in a saturation region.

A transconductance or mutual conductance gm in the linear region is:

$$gm = \mu C_{ox}\left(V_{GS}-V_{th}-\frac{V_{DS}}{2}\right).$$

The mutual conductance in the linear region thus has a linear dependence on the mobility $\mu$ and is no longer dependent on the square root of $\mu$ (compare mutual conductance when operating in the saturation region).

Using a cascode circuit (exemplarily using the p-channel cascode field-effect transistors 820, 822), the frequency fn provided by a ring oscillator set up to include n-channel input field-effect transistors is proportional to $1+\pi_n^*(\sigma_{xx}+\sigma_{yy})$. Thus, the stress sensitivity of the oscillator frequencies increases to about double a value (compared to a ring oscillator where the input field-effect transistors are operated in a saturation region).

An amplification necessary in the transconductance stages (exemplarily in the transconductance stage 800 of FIG. 8) is achieved by cascodes (i.e., essentially by the cascode field-effect transistors 820, 822) which increase the relatively small output resistances of the input transistors 810, 812 operated in the linear region advantageously by more than one order of magnitude.

An advantage of the circuit arrangement of FIG. 8 is that it has a higher sensitivity towards changes in mechanical stress compared to conventional circuit arrangements (i.e., exemplarily compared to differential amplifiers comprising input transistors operated in a saturation region).

Figure 9:
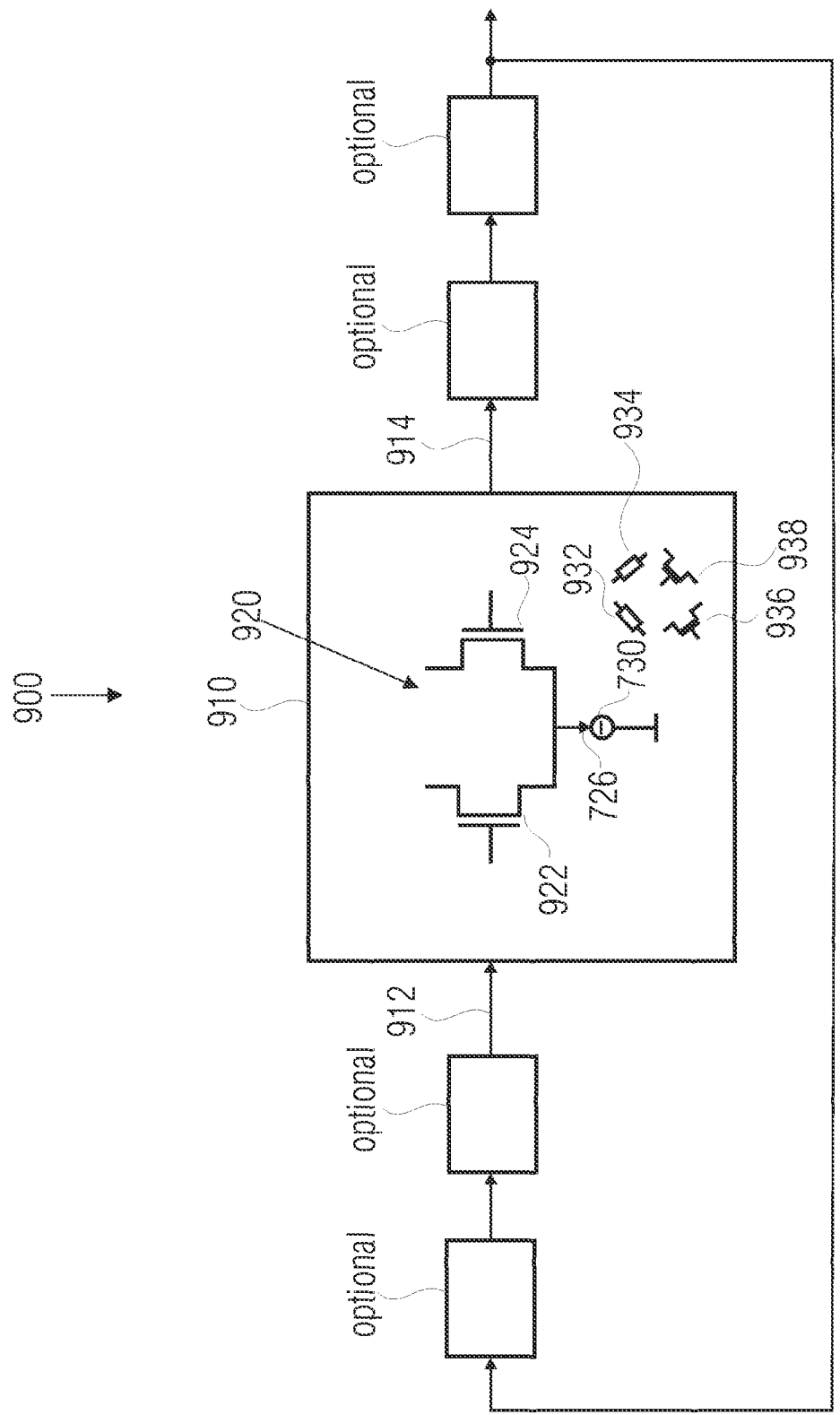
FIG. 9 shows a block circuit diagram of an inventive ring oscillator comprising a ring oscillator stage the operating point current of which is determined by two mutually perpendicular resistors or two mutually perpendicular transistors according to an embodiment of the present invention.

FIG. 9 shows a block circuit diagram of an inventive ring oscillator including an operating point setting dependent on mechanical stress according to an embodiment of the present invention. The circuit arrangement of FIG. 9 in its entirety is referred to by 900. The ring oscillator 900 includes a ring oscillator stage 910 comprising an input for an oscillator stage input signal 912 and an output for an oscillator stage output signal 914. The ring oscillator stage 910 includes a differential amplifier 920 comprising an input for the oscillator stage input signal 912 and an output for the oscillator stage output signal 914. The differential amplifier includes a pair of input field-effect transistors 922, 924 the operating point of which is determined by an operating point current 926. The ring oscillator stage 910 additionally includes operating point current-adjusting means 930 which includes an output for an operating point current 926. The operating point current-adjusting means includes, as devices determining the operating point current, two resistors 932, 934 functionally corresponding to each other or two transistors 936, 938 functionally corresponding to each other which together enclose an angle in a range between degrees and 120 degrees.

The mode of functioning of the circuit arrangement 900 described is based on the fact that the operating point current 926 provided by the operating point current source 930 with the wiring mentioned provides an operating point current which depends on mechanical stress. This is, for example, achieved by using, as elements determining the operating point current, resistors diffused into a semiconductor chip. Due to the dependence of the charge carrier mobility μ, the resistance of the indiffused resistors is dependent on mechanical stress in the semiconductor chip. When the resistance of the indiffused resistors mentioned changes, the operating point current 926 provided by the operating point current source 930 changes when the indiffused resistors mentioned serve as elements determining the operating point current. Additionally, it is of advantage for the operating point current 926 to be determined by two resistors which are basically arranged perpendicularly to each other (and/or twisted in an angular range between 60 degrees and 120 degrees). In other words, the indiffused resistors twisted to each other by approximately 90 degrees are the two elements of the operating point current source 930 determining the operating point current.

In an alternative embodiment, two field-effect transistors which are approximately arranged to each other orthogonally serve as elements determining the operating point current. Field-effect transistors, too, are subjected to a change in electrical characteristics when mechanical stress changes in the semiconductor chip in which the field-effect transistors are formed.

Furthermore, the fact that advantageously two elements (resistors or field-effect transistors) determining the operating point current twisted to each other by approximately 90 degrees are used results in a dependence of the operating point current on a direction of mechanical stress which is reduced compared to arrangements comprising only one element determining the operating point current. Rather, basically a magnitude of mechanical stress determines the operating point current 926.

Put generally, it can be stated that a particularly advantageous design of the inventive concept results when the operating point current or bias current (i.e., exemplarily the low-end current of the input field-effect transistors of the differential amplifiers described above) is made to be stress-dependent. Exemplarily, the operating point current for an N transconductance stage (i.e., for a differential amplifier comprising n-channel input field-effect transistors) can be generated from a p-type resistance L (i.e., exemplarily using two approximately perpendicular p-doped resistors) or from a current generated from a band gap (i.e., a band gap reference voltage source or a band gap reference current source) and two mutually perpendicular P-MOS transistors. In a P-transconductance stage (i.e., exemplarily in a differential amplifier comprising p-channel input field-effect transistors), an operating point current can be generated from an n-type resistance L (i.e., exemplarily from two approximately mutually perpendicular n-doped resistors connected in series) or from a band gap circuit and two approximately mutually perpendicular n-MOS transistors.

Thus, the transconductance gm (of a differential amplifier), even without using a cascode, is approximately proportional to:

$$(sqrt(1+\pi_n{}^*(\sigma_{xx}+\sigma_{yy})))2=1+\pi_n{}^*(\sigma_{xx}+\sigma_{yy}).$$

Using cascodes (i.e. exemplarily when operating the input field-effect transistors in a triode region and additionally using cascodes), the transconductance gm even is proportional to:

$$(1+\pi_n{}^*(\sigma_{xx}+\sigma_{yy}))1,5.$$

The design mentioned entails the disadvantage that the two currents are subject to mutual process dispersion and have to be matched in embodiments. However, the design mentioned where the bias currents are also stress-dependent entails the advantage that still higher stress dependence can be achieved than in the other circuit arrangements.

In summary, it can be stated that referring to FIG. 4 two ring oscillators including p-channel input and n-channel input and digital evaluation of the oscillator frequency ratios are shown, the result being that all in all differently strong variations in the oscillator frequencies of the two ring oscillators can be evaluated with mechanical stress in a semiconductor chip.

Circuit details of the corresponding ring oscillators according to an embodiment of the present invention have been described referring to FIG. 6. According to FIG. 6, transconductance stages including input stages which are each arranged perpendicular in a chip layout and connected in parallel and a common bias circuit are shown.

With regard to FIG. 6, it is to be mentioned that respective signals and/or terminals having equal labels are connected to each other so that exemplarily −Vin is connected to −Vin elsewhere. Due to the common operating point setting, the ring oscillators coupled according to FIG. 6 exhibit an improved temperature behavior compared to ring oscillators including a separate operating point setting. Furthermore, process tolerances have less disturbing an influence when using a coupled operating point setting.

Additionally, a transconductance stage including input transistors operated in a linear range has been shown referring to FIG. 8. The result of the concept as mentioned is a particularly strong dependence of the transconductance gm of the differential amplifier on mechanical stress on the semiconductor chip.

Figure 10:
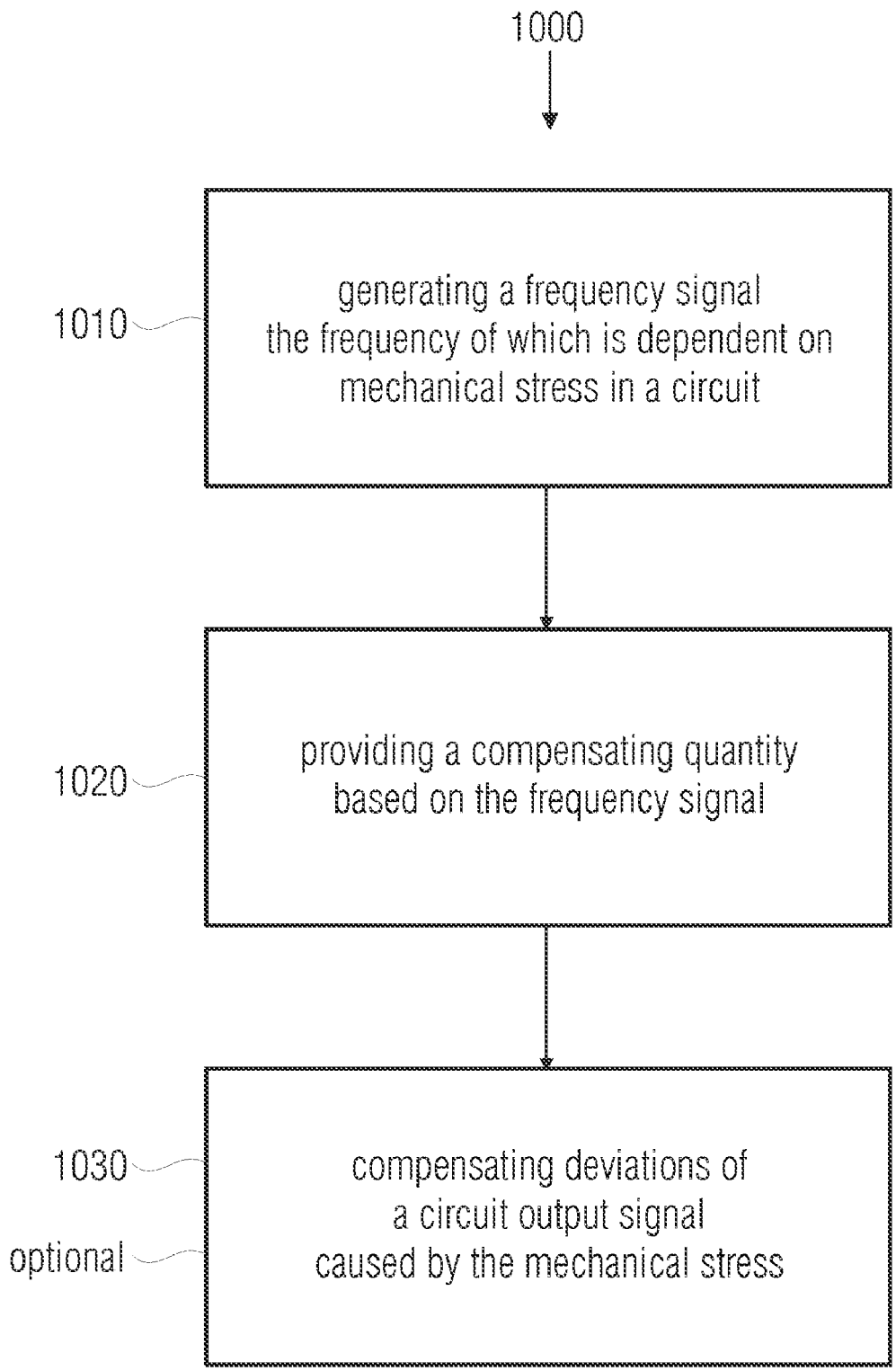
FIG. 10 shows a flow chart of an inventive method for providing a compensating quantity according to an embodiment of the present invention.

FIG. 10 shows a flow chart of an inventive method for providing a compensating quantity. The method of FIG. 10 in its entirety is referred to by 1000. The method 1000 includes generating 1010 a frequency signal the frequency of which depends on mechanical stress in a circuit. The method 1000 additionally includes providing 1020 a compensating quantity based on the frequency signal, wherein the compensating quantity in an embodiment allows compensating deviations of a circuit output signal caused by mechanical stress.

Optionally, the method 1000 includes compensating 1030 deviations of a circuit output signal caused by mechanical stress.

It is pointed out that the method 1000 of FIG. 10 may be supplemented by all those steps executed by the inventive apparatuses.

In summary, it can be stated that the present invention according to one aspect allows compensating mechanical stress effects which influence a precision of Hall sensors, band gap references, temperature sensors, stable on-chip oscillators and, generally, high-precision analog circuits.

In one embodiment, the present invention overcomes losses in precision when compensating and/or compensating stress which are caused by conventionally used analog evaluating circuits. Additionally, the present invention according to one embodiment overcomes the high area consumption occurring when using conventionally used analog circuits.

In summary, it can be stated that in a particularly advantageous embodiment of the present invention, two ring oscillators comprising different inputs (p-channel MOS and n-channel MOS) in the transconductance stages used generate oscillator frequencies of different stress sensitivities. A difference or a ratio of the two frequencies can be evaluated easily and in an area-saving manner in a digital evaluating circuit and be used for compensating undesired stress sensitivities in sensors, band gaps, temperature sensors or precise on-chip oscillators. Stress-sensitive signals (like for example sensor signals) can easily be compensated digitally.

Generally, it can be stated that the present invention according to one aspect also provides a digital stress sensor. In other words, the inventive compensating quantity-providing circuit and/or the inventive ring oscillators may generally be interpreted as stress sensors.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A compensating quantity-providing circuit, comprising:
   a frequency signal generator comprising an output for a frequency signal having a frequency that depends on a mechanical stress in a circuit; and
   a compensating quantity provider comprising an input for the frequency signal and an output for carrying a compensating quantity that is based on the frequency signal and an additional frequency signal,
   wherein the frequency signal generator comprises a first ring oscillator configured to provide the frequency signal and a second ring oscillator configured to provide the additional frequency signal,
   wherein input field-effect transistors of an element of the first ring oscillator comprises a different channel configuration than input field-effect transistors of an element of the second ring oscillator.

2. The compensating quantity-providing circuit according to claim 1, wherein the compensating quantity provider comprises a digital evaluating circuit, the digital evaluating circuit including a frequency evaluating circuit and a digital calculating circuit,
   wherein the frequency evaluating circuit comprises an input for the frequency signal and an interface for digital frequency information that depends on the frequency of the frequency signal, and
   wherein the digital calculating circuit comprises the interface for the digital frequency information and an interface for digital compensating quantity information that is derived using a calculating operation or a lookup operation.

3. The compensating quantity-providing circuit according to claim 2, wherein the digital evaluating circuit comprises a compensating quantity-outputting circuit, the compensating quantity-outputting circuit comprising the interface for the digital compensating quantity information and an output for an analog current value and an analog voltage value that describes the compensating quantity.

4. The compensating quantity-providing circuit according to claim 1, wherein the frequency signal generator comprises a first output for a first frequency signal and a second output for a second frequency signal,
   wherein a frequency of the first frequency signal and a frequency of the second frequency signal comprise different dependences on the mechanical stress in the circuit,
   wherein the compensating quantity-providing circuit comprises a first input for the first frequency signal, a second input for the second frequency signal and an output for the compensating quantity,
   wherein the compensating quantity comprises a functional dependence on a ratio between the frequency of the first frequency signal and the frequency of the second frequency signal, or
   wherein the compensating quantity comprises a functional dependence on a difference between the frequency of the first frequency signal and the frequency of the second frequency signal.

5. The compensating quantity-providing circuit according to claim 4, wherein a relative dependence of the frequency of the first frequency signal on the mechanical stress that is defined as a quotient between a relative change in frequency and a respective change in a magnitude of the mechanical stress differs from a relative dependence of the frequency of the second frequency signal on the mechanical stress by at least 10%/GPa.

6. The compensating quantity-providing circuit according to claim 4, wherein the frequency signal generator comprises a first ring oscillator and a second ring oscillator,
   wherein the first ring oscillator includes an output for the first frequency signal and includes a p-input ring oscillator stage,
   wherein the second ring oscillator includes an output for the second frequency signal and an n-input ring oscillator stage,
   wherein the p-input ring oscillator stage includes an input for an oscillator stage input signal and an output for an oscillator stage output signal, and an input differential amplifier comprising a pair of p-channel differential amplifier input field-effect transistors,
   wherein the n-input ring oscillator stage includes an input for the oscillator stage input signal and an output for the oscillator stage output signal, and an input differential amplifier comprising a pair of n-channel differential amplifier input field-effect transistors, and
   wherein the first ring oscillator and the second ring oscillator are arranged on a same semiconductor chip.

7. The compensating quantity-providing circuit according to claim 6, wherein the frequency signal generator comprises an operating point-adjusting circuit comprising a first output for a first operating point-adjusting signal and a second output for a second operating point-adjusting signal, the first output of the first operating point-adjusting circuit being coupled to an operating point-adjusting input of the first ring oscillator, the second output of the second operating point-adjusting circuit being coupled to an operating point-adjusting input of the second ring oscillator, and the first operating point-adjusting signal and the second operating point-adjusting signal being derived from a common reference signal.

8. The compensating quantity-providing circuit according to claim 1, wherein the frequency signal generator comprises a ring oscillator, the ring oscillator comprising:
- a ring oscillator stage comprising an input for an oscillator stage input signal and an output for an oscillator stage output signal that is inverted compared to the oscillator stage input signal, wherein the ring oscillator stage comprises a differential amplifier comprising an input for the oscillator stage input signal and an output for the oscillator stage output signal, wherein the differential amplifier includes a pair of input field-effect transistors that are operated by an operating point current in a triode region, wherein the differential amplifier comprises an operating point current-adjusting circuit that provides the operating point current; and
- an output for a ring oscillator output signal having a frequency based on a frequency of the oscillator stage output signal.

9. The compensating quantity-providing circuit according to claim 1, wherein the frequency signal generator comprising a ring oscillator, the ring oscillator comprising:
- a ring oscillator stage comprising an input for an oscillator stage input signal and an output for an oscillator stage output signal that is inverted compared to the oscillator stage input signal, wherein the ring oscillator stage comprises a differential amplifier comprising an input for the oscillator stage input signal and an output for the oscillator stage output signal, wherein the differential amplifier includes a pair of input field-effect transistors, the operating point of which is determined by an operating point current;
- an operating point current adjuster that includes an output for the operating point current, wherein the operating point current adjuster includes, as devices determining the operating point current, two functionally corresponding resistors or two functionally corresponding transistors which together enclose an angle in a range of between about 60 degrees and about 120 degrees.

10. The compensating quantity-providing circuit according to claim 1, wherein the compensating quantity provider includes an input for an external reference frequency signal generated outside a semiconductor chip on which the frequency signal generator is arranged, and
- wherein the compensating quantity is dependent on the frequency signal and the reference frequency signal.

11. A stress-compensating circuit, comprising:
- a frequency signal generator comprising an output for a frequency signal the frequency of which depends on mechanical stress in a useful circuit that provides a useful circuit signal;
- a compensating quantity provider comprising an input for the frequency signal and an output for a compensating quantity that is based on the frequency signal; and
- a correction circuit comprising an input for the useful circuit signal and depends on the mechanical stress in the useful circuit, an input for the compensating quantity, and an output for a corrected useful circuit signal,
- wherein the corrected useful circuit signal is based on the useful circuit signal, and
- wherein a dependence of the useful circuit signal on the mechanical stress in the corrected useful circuit signal is compensated using the compensating quantity derived from the frequency signal.

12. The stress-compensating circuit according to claim 11, wherein the compensating quantity provider includes a digital evaluating circuit,
- wherein the digital evaluating circuit includes a frequency-evaluating circuit,
- wherein the frequency-evaluating circuit includes an input for the frequency signal and an interface for digital frequency information that depends on a frequency of the frequency signal, and
- wherein the correction circuits comprise a digital calculating circuit comprising an interface for the digital frequency information, a digital input interface for the digital or digitalized useful circuit signal, and a digital output interface for the corrected useful circuit signal.

13. The stress-compensating circuit according to claim 11,
- wherein the frequency signal generator comprises a first output for a first frequency signal and a second output for a second frequency signal,
- wherein a frequency of the first frequency signal and a frequency of the second frequency signal comprise different dependencies on the mechanical stress in the circuit;
- wherein the compensating quantity provider comprises a first input for the first frequency signal, a second input for the second frequency signal, and an output for the compensating quantity,
- wherein the compensating quantity comprises a functional dependence on a ratio between the frequency of the first frequency signal and a frequency of the second frequency signal, or
- wherein the compensating quantity comprises a functional dependence on a difference between the frequency of the first frequency signal and the frequency of the second frequency signal.

14. The stress-compensating circuit according to claim 11, wherein the useful circuit comprises a sensor circuit comprising a sensor element, the sensor circuit being arranged on the same semiconductor chip as the frequency signal generator, the useful circuit signal describing a measuring quantity measured by the sensor element and comprising a parasitic dependence on the mechanical stress in the useful circuit.

15. The stress-compensating circuit according to claim 11, wherein the frequency signal generator is arranged on a semiconductor chip, and wherein a distance between a center of gravity of the semiconductor chip and the frequency signal generator is smaller than a distance between any edge of the semiconductor chip and the frequency signal generator.

16. A stress-compensated circuit, comprising:
- a useful circuit comprising an output for a useful signal and an input for a compensation signal that determines an operating point of the useful circuit and allows mechanical stress in the useful circuit to be compensated;
- a frequency signal generator having a frequency that depends on the mechanical stress in the useful circuit; and
- a compensating quantity provider comprising an input receiving the frequency signal and an output providing the compensation signal, the compensation signal being based on the frequency signal.

17. The stress-compensated circuit according to claim 16, wherein the compensating quantity provider includes a digital evaluating circuit,
- wherein the digital evaluating circuit includes a frequency-evaluating circuit, a digital calculating circuit and a compensating quantity-outputting circuit,
- wherein the frequency-evaluating circuit comprises an input for the frequency signal and an interface for digital frequency information that depends on a frequency of the frequency signal;
- wherein the digital calculating circuit includes an interface for the digital frequency information and an interface for digital compensating quantity information that is derived from the digital frequency information using a calculating operation or a lookup operation; and wherein the compensating quantity-outputting circuit includes an interface for the digital compensating quantity information and an output for an analog current value or an analog voltage value that represents the compensating quantity.

18. The stress-compensated circuit according to claim 16, wherein the frequency signal generator includes a first output for a first frequency signal and a second output for a second frequency signal, wherein a frequency of the first frequency signal and a frequency of the second frequency signal comprise different dependences on the mechanical stress in the circuit;

wherein the compensating quantity provider comprises a first input for the first frequency signal, a second input for the second frequency signal, and an output for the compensating quantity; and wherein the compensating quantity comprises a functional dependence on a ratio between a frequency of the first frequency signal and a frequency of the second frequency signal, or wherein the compensating quantity comprises a functional dependence on a difference between a frequency of the first frequency signal and a frequency of the second frequency signal.

19. The stress-compensated circuit according to claim 16, wherein the useful circuit includes a band gap reference voltage source or a band gap reference current source.

20. The stress-compensated circuit according to claim 16, wherein the useful circuit includes an oscillator, the input for the compensating quantity being coupled to a frequency-determining element of the oscillator.

21. A compensating quantity-providing circuit, comprising:

a frequency signal generator comprising a first output for a first frequency signal and a second output for a second frequency signal, a frequency of the first frequency signal and a frequency of the second frequency signal comprising different dependences on mechanical stress in a semiconductor chip;

a compensating quantity provider comprising a first input for the first frequency signal, a second input for the second frequency signal, and an output for the compensating quantity, wherein the compensating quantity provider includes a digital evaluating circuit, wherein the digital evaluating circuit includes a frequency-evaluating circuit and a digital calculating circuit, wherein the frequency-evaluating circuit comprises an input for the frequency signal and an interface for digital frequency information which depends on a frequency of the frequency signal;

wherein the digital calculating circuit comprises an interface for the digital frequency information and an interface for digital compensating quantity information;

wherein the compensating quantity comprises a functional dependence on a ratio between a frequency of the first frequency signal and a frequency of the second frequency signal, or wherein the compensating quantity comprises a functional dependence on a difference between a frequency of the first frequency signal and a frequency of the second frequency signal;

wherein the first frequency signal generator includes a first ring oscillator, and wherein the second frequency signal generator includes a second ring oscillator;

wherein the first ring oscillator includes a respective ring oscillator stage comprising an input for an oscillator stage input signal and an output for an oscillator stage output signal which is inverted compared to the oscillator stage input signal, wherein the ring oscillator stage of the first ring oscillator includes an input differential amplifier comprising a pair of p-channel input field-effect transistors;

wherein the second ring oscillator includes a respective ring oscillator stage comprising an input for an oscillator stage input signal and an output for an oscillator stage output signal which is inverted compared to the oscillator stage input signal;

wherein the ring oscillator stage of the second ring oscillator includes an input differential amplifier comprising a pair of n-channel input field-effect transistors.

22. An apparatus for providing a compensating quantity for compensating variations of an output signal of a circuit caused by mechanical stress, comprising:

means for generating a frequency signal having a frequency that depends on the mechanical stress;

means for generating an additional frequency signal; and means for providing a compensating quantity based on the frequency signal and the additional frequency signal;

wherein input field-effect transistors of a difference amplifier of the means for providing a frequency signal comprise a different channel-type than input field-effect transistors of the means for generating an additional frequency signal.

23. The apparatus according to claim 22, wherein the means for providing the compensating quantity includes a digital evaluating circuit, wherein the digital evaluating circuit comprises a frequency-evaluating circuit for providing digital frequency information based on the frequency signal, and a digital calculating circuit for providing digital compensating quantity information based on the digital frequency information using a calculating operation or lookup operation.

24. The apparatus according to claim 23, wherein the digital evaluating circuit includes a compensating quantity-outputting circuit for providing an analog current value or an analog voltage value which represents the compensating quantity based on the digital compensating quantity information.

25. The apparatus according to claim 22, wherein the means for generating a frequency signal comprises means for providing two frequency signals comprising different dependences on the mechanical stress in the circuit, and wherein the means for providing the compensating quantity comprises means for providing the compensating quantity in functional dependence on a ratio between a frequency of the first frequency signal and a frequency of the second frequency signal or in functional dependence on a difference between a frequency of the first frequency signal and a frequency of the second frequency signal.

26. A method for providing a compensating quantity, comprising:

generating a frequency signal having a frequency that depends on mechanical stress in a useful circuit;

providing a compensating quantity based on the frequency signal, the compensating quantity allowing variations of an output signal of the useful circuit caused by mechanical stress to be compensated; and providing a corrected useful-circuit-signal based on the output signal of the useful circuit and the compensating quantity.

27. A ring oscillator, comprising:

a ring oscillator stage comprising an input for an oscillator stage input signal and an output for an oscillator stage output signal which is inverted compared to the oscillator stage input signal, wherein the ring oscillator stage includes a parallel connection including a first differential amplifier and a second differential amplifier, wherein the first differential amplifier includes a first pair of input field-effect transistors, the second differential amplifier including a second pair of input field-effect transistors, and wherein a channel direction of a field-effect transistor of the first pair of input field-effect transistors encloses an angle in a range between 60 degrees and 120 degrees with a channel direction of a field-effect transistor of the second pair of input field-effect transistors; and an output for a ring oscillator output signal the frequency of which is based on a frequency of the oscillator stage output signal.

28. A ring oscillator, comprising:

a ring oscillator stage comprising an input for an oscillator stage input signal and an output for an oscillator stage output signal which is inverted compared to the oscillator stage input signal, wherein the ring oscillator stage includes a differential amplifier comprising an input for the oscillator stage input signal and an output for the oscillator stage output signal, wherein the differential amplifier includes a pair of input field-effect transistors which are operated by an operating point current in a triode region, wherein the differential amplifier includes an operating point current-adjusting circuit which provides the operating point current; and an output for a ring oscillator output signal the frequency of which is based on a frequency of the oscillator stage output signal.

29. The ring oscillator according to claim 28, wherein the differential amplifier comprises a pair of cascode transistors, source terminals of the input field-effect transistors being coupled to a low-end current source, a drain terminal of a first input field-effect transistor being coupled to a source terminal of a first cascode transistor, a drain terminal of a second input field-effect transistor being coupled to a source terminal of a second cascode transistor, and wherein control terminals of the two cascode transistors are coupled to each other or to the same potentials.

30. The ring oscillator according to claim 29, wherein the differential amplifier comprises a cascode control terminal potential-generating transistor, a source terminal of the cascode control terminal potential-generating transistor being coupled to the source terminals of the input field-effect transistors, wherein a drain terminal of the cascode control terminal potential-generating transistor is coupled to a control terminal of the cascode control terminal potential-generating transistor, a drain terminal of the cascode control terminal potential-generating transistor being coupled to a current source.

31. The ring oscillator according to claim 30, wherein the first cascode transistor is a field-effect transistor, wherein the second cascode transistor is a field-effect transistor, wherein the cascode control terminal potential-generating transistor is a field-effect transistor, and wherein the cascode control terminal potential-generating transistor operates in a saturation region.

32. A ring oscillator, comprising:

a ring oscillator stage comprising an input for an oscillator stage input signal and an output for an oscillator stage output signal which is inverted compared to the oscillator stage input signal, wherein the ring oscillator stage includes a differential amplifier comprising an input for the oscillator stage input signal and an output for the oscillator stage output signal, wherein the differential amplifier includes a pair of input field-effect transistors, the operating point of which is determined by an operating point current;

wherein the ring oscillator includes an operating point current adjuster which includes an output for the operating point current, wherein the operating point current adjuster comprises, as devices determining the operating point current, two functionally corresponding resistors or two functionally corresponding transistors which together enclose an angle in a range between 60 degrees and 120 degrees.

33. The ring oscillator according to claim 32, wherein the operating point current adjuster is arranged on the same semiconductor chip as the ring oscillator, wherein the operating point current depends on mechanical stress in the semiconductor chip, and wherein the input field-effect transistors are subjected to mechanical stress.

34. The ring oscillator according to claim 32, wherein the input field-effect transistors are operated by the operating point current in a triode region.

35. A compensating quantity-providing circuit, comprising:

a frequency signal generator comprising an output for a frequency signal having a frequency that depends on a mechanical stress in a circuit; and a compensating quantity provider comprising an input for the frequency signal and an output for carrying a compensating quantity that is based on the frequency signal;

wherein the frequency signal generator comprises a ring oscillator, the ring oscillator comprising:

a ring oscillator stage comprising an input for an oscillator stage input signal and an output for an oscillator stage output signal that is inverted compared to the oscillator stage input signal, wherein the ring oscillator stage comprises a parallel connection including a first differential amplifier and a second differential amplifier, wherein the first differential amplifier comprises a first pair of input field-effect transistors, the second differential amplifier comprising a second pair of input field-effect transistors, and wherein a first channel direction of a field-effect transistor of the first pair of input field-effect transistors encloses an angle in a range between about 60 degrees and about 120 degrees with a second channel direction of a field-effect transistor of the second pair of input field-effect transistors; and an output for a ring oscillator output signal a frequency of which is based on a frequency of the oscillator stage output signal.

36. The compensating quantity-providing circuit according to claim 1, wherein:
    the element of the first ring oscillator comprises a first difference amplifier;
    the element of the second ring oscillator comprises a second difference amplifier.

37. The compensating quantity-providing circuit according to claim 1, wherein the different channel configuration comprises different channel type.

38. The compensating quantity-providing circuit according to claim 1, wherein the different channel configuration comprises a different channel orientation.

39. The compensating quantity-providing circuit according to claim 1, wherein the different channel orientation comprises a difference in angle between about 60 degrees and about 120 degrees.

* * * * *